US008121801B2

(12) United States Patent
Spanier et al.

(10) Patent No.: US 8,121,801 B2
(45) Date of Patent: Feb. 21, 2012

(54) SYSTEM AND METHOD FOR MULTI-RATE CONCURRENT WAVEFORM CAPTURE AND STORAGE FOR POWER QUALITY METERING

(75) Inventors: Joseph Spanier, Brooklyn, NY (US);
Hai Zhu, Glen Cove, NY (US);
Frederick B. Slota, Lake Ronkonkoma, NY (US)

(73) Assignee: Electro Industries/Gauge Tech, Westbury, NY (US)

( * ) Notice: Subject to any disclaimer, the term of this patent is extended or adjusted under 35 U.S.C. 154(b) by 269 days.

(21) Appl. No.: 12/211,447

(22) Filed: Sep. 16, 2008

(65) Prior Publication Data

US 2009/0012728 A1   Jan. 8, 2009

Related U.S. Application Data

(63) Continuation-in-part of application No. 12/075,747, filed on Mar. 13, 2008, which is a continuation-in-part of application No. 12/036,356, filed on Feb. 25, 2008, now Pat. No. 7,899,630, which is a continuation-in-part of application No. 11/341,802, filed on Jan. 27, 2006, now Pat. No. 7,337,081.

(60) Provisional application No. 60/647,669, filed on Jan. 27, 2005.

(51) Int. Cl.
*G01R 13/00* (2006.01)
*G01R 13/02* (2006.01)
*G06F 19/00* (2011.01)
*G06F 17/40* (2006.01)

(52) U.S. Cl. .......... 702/61; 324/76.38; 702/60; 702/189

(58) Field of Classification Search ................. 73/76.11, 73/76.12, 76.38, 115, 158.1, 432.1, 865.8; 341/50, 87, 122, 123; 702/1, 57, 60, 61, 702/64, 66, 67, 70, 127, 189, 190; 707/705, 707/722, 736; 709/213; 719/312; 324/76.11, 324/76.12, 76.38, 115
See application file for complete search history.

(56) References Cited

U.S. PATENT DOCUMENTS

| | | | |
|---|---|---|---|
| 3,504,164 A * | 3/1970 | Lachenmayer et al. ........ 702/73 |
| 3,824,441 A | 7/1974 | Heyman et al. |
| 4,215,697 A | 8/1980 | Demetrescu |
| 4,255,707 A | 3/1981 | Miller |
| 4,884,021 A | 11/1989 | Hammond et al. |
| 4,958,640 A * | 9/1990 | Logan ........................... 600/484 |
| 4,996,646 A | 2/1991 | Farrington |
| 5,166,887 A | 11/1992 | Farrington et al. |
| 5,170,360 A | 12/1992 | Porter et al. |
| 5,402,148 A * | 3/1995 | Post et al. ..................... 345/698 |
| 5,475,628 A * | 12/1995 | Adams et al. ................. 708/313 |
| 5,757,357 A * | 5/1998 | Grande et al. ............. 345/440.1 |
| 6,018,690 A | 1/2000 | Saito et al. |

(Continued)

*Primary Examiner* — Edward Cosimano
(74) *Attorney, Agent, or Firm* — Gerald E. Hespos; Michael J. Porco

(57) ABSTRACT

Systems and methods are provided for use in an IED that perform high resolution waveform capture to generate multi-rate waveform data in real-time. In one embodiment, high-resolution sampled data is dynamically pre-ordered into separate high resolution and low resolution data streams for presentation and storage. This pre-ordering of data is optimized so as to minimize the amount of data manipulation required to prepare the sampled data for eventual presentation and storage in the IED. Pre-ordering of data facilitates minimum performance impact so that continuous real-time data capture can be achieved.

26 Claims, 11 Drawing Sheets

U.S. PATENT DOCUMENTS

| | | | |
|---|---|---|---|
| 6,098,175 A | 8/2000 | Lee | |
| 6,167,329 A | 12/2000 | Engel et al. | |
| 6,396,421 B1 * | 5/2002 | Bland | 341/61 |
| 6,415,244 B1 * | 7/2002 | Dickens et al. | 702/187 |
| 6,483,291 B1 | 11/2002 | Bhateja et al. | |
| 6,509,850 B1 * | 1/2003 | Bland | 341/61 |
| 6,528,957 B1 | 3/2003 | Luchaco | |
| 6,636,030 B1 | 10/2003 | Rose et al. | |
| 6,661,357 B2 * | 12/2003 | Bland | 341/61 |
| 6,751,563 B2 * | 6/2004 | Spanier et al. | 702/61 |
| 7,337,081 B1 * | 2/2008 | Kagan | 702/60 |
| 7,554,320 B2 * | 6/2009 | Kagan | 324/142 |
| 7,577,542 B2 * | 8/2009 | Vacar et al. | 702/124 |
| 7,899,630 B2 * | 3/2011 | Kagan | 702/60 |
| 7,916,060 B2 * | 3/2011 | Zhu et al. | 341/155 |
| 7,974,713 B2 * | 7/2011 | Disch et al. | 700/94 |
| 7,996,171 B2 * | 8/2011 | Banhegyesi | 702/85 |
| 8,022,690 B2 * | 9/2011 | Kagan | 324/142 |
| 2002/0169570 A1 * | 11/2002 | Spanier et al. | 702/61 |
| 2003/0025620 A1 * | 2/2003 | Bland | 341/61 |
| 2003/0076247 A1 * | 4/2003 | Bland | 341/61 |
| 2003/0187550 A1 | 10/2003 | Wilson et al. | |
| 2007/0081597 A1 * | 4/2007 | Disch et al. | 375/242 |
| 2007/0096765 A1 * | 5/2007 | Kagan | 324/765 |
| 2007/0096942 A1 * | 5/2007 | Kagan et al. | 340/870.02 |
| 2007/0114987 A1 * | 5/2007 | Kagan | 324/142 |
| 2008/0086222 A1 * | 4/2008 | Kagan | 700/22 |
| 2008/0147334 A1 * | 6/2008 | Kagan | 702/60 |
| 2008/0172192 A1 * | 7/2008 | Banhegyesi | 702/61 |
| 2008/0215264 A1 * | 9/2008 | Spanier et al. | 702/62 |
| 2008/0235355 A1 * | 9/2008 | Spanier et al. | 709/219 |
| 2008/0252481 A1 * | 10/2008 | Vacar et al. | 340/870.38 |
| 2009/0096654 A1 * | 4/2009 | Zhu et al. | 341/155 |
| 2009/0228224 A1 * | 9/2009 | Spanier et al. | 702/60 |
| 2009/0265124 A1 * | 10/2009 | Kagan | 702/62 |
| 2010/0324845 A1 * | 12/2010 | Spanier et al. | 702/62 |

* cited by examiner

SYSTEM AND METHOD FOR MULTI-RATE CONCURRENT WAVEFORM CAPTURE AND STORAGE FOR POWER QUALITY METERING

PRIORITY

This application is a continuation-in-part application of pending U.S. patent application Ser. No. 12/075,747 filed on Mar. 13, 2008, the contents of which is hereby incorporated by reference in its entirety.

This application is related to U.S. patent application Ser. No. 12/036,356 filed on Feb. 25, 2008, now U.S. Pat. No. 7,899,630, which is a continuation application of U.S. patent application Ser. No. 11/341,802 filed on Jan. 27, 2006 entitled "METERING DEVICE WITH CONTROL FUNCTIONALITY AND METHOD THEREOF", now U.S. Pat. No. 7,337,081, which claims priority to expired U.S. Provisional Patent Application Ser. No. 60/647,669 filed on Jan. 27, 2005, the contents of which are hereby incorporated by reference in their entireties.

FIELD

The present disclosure relates generally to an intelligent electronic device (IED), such as used by commercial, industrial, or residential customers of power utility companies and, more particularly, to an IED having various operational capabilities such as power quality measurement and/or energy management, and, in particular, to an IED capable of capturing and recording concurrent waveform data at multiple data rates in real time.

SUMMARY

An advanced feature for a power meter and for power quality monitoring is to be able to capture and record waveform data (i.e., perform data logging) at multiple rates concurrently in real-time. This is beneficial in that it allows the simultaneous capture of events which require a high resolution data capture with other events which require a lower resolution data capture. The high resolution events are captured using a high sample rate while the low resolution events are captured using a low sample rate, with the low resolution events being captured over a longer period of time. One example of a high resolution event monitored in an IED is a transient capture and one example of a low resolution event monitored in an IED is a Surge/Sag waveform capture.

In the case of a high speed transient capture event (e.g., transient capture), a high resolution sampling rate of 1024 samples/cycle or higher is desirable to observe the high speed transients. In the case of a low speed event (e.g., Surge/Sag waveform capture), a low resolution sampling rate of 128 samples per cycle is desirable to support capture over a longer period of time, such as 3 seconds, or continuously in some cases without requiring use of excessive resources of the IED.

Conventional hardware architectures can not support multiple rate waveform capture (data logging) due to burdens placed on both the processing (performance limitations) and data management and storage of the waveform data (memory bandwidth limitation and memory size).

For example, by not utilizing the data management techniques of the present disclosure, waveform capture data is conventionally pooled into a single large data buffer whose size must be sufficient to accommodate data over large intervals of time (e.g., on the order of 3 seconds or more) to support low sample rate data time intervals. To present both high and low resolution data capture, the actual sample rate would have to be set at the higher sample rate to maintain the high resolution data capture while the time interval of the data capture would be set by the requirements of a low resolution interval capture time, which can be long.

By way of example, if the high resolution sample rate is 1024 samples per cycle and the sample rate requirement of the low resolution waveform capture is 128 samples per cycle, then using the high sample rate for all captures would require a storage requirement 8 times larger (i.e., 1024/128) than is really needed for low resolution waveform capture. As a further requirement, considering that the data is captured in a single large memory pool of samples captured at the higher rate (e.g., 1024 samples/cycle), a processor or central processing unit (CPU) would be required to identify and select the low resolution data from the memory pool (e.g., selecting every eighth sample to construct an image of the low resolution waveform capture). As understood by those skilled in the art, this is a very inefficient process for a general purpose CPU.

Conversely, for a system optimized to do low resolution waveform capture continuously, which is a requirement for the IED to capture slow changing SAG and SWELLs which tend to change slowly, the CPU is required to select every eighth sample (using the instant example) in real-time, which is a very difficult performance goal for a CPU to achieve and costly to implement given the current state of technology. Further, the use of a single large pool of memory is also processing inefficient because all the data captured at the high sample rate must then be read to access those data points which define a low resolution data stream. For example, if the high sample rate is 1024 samples per cycle and the low sample rate is 128 samples per cycle, for the low sample rate data (i.e., 128 samples per cycle), every eighth sample (i.e., 1024/128=8) is extracted from the 1024 sample stream. For example, by extracting every eighth data point from the high resolution 1024 bit data stream, a low resolution data stream may be dynamically constructed having a sample rate of 128 samples per cycle.

A need therefore exists for a hardware architecture that is capable of supporting multiple rate waveform capture (data logging) and which overcomes the performance limitations, memory bandwidth limitation and memory size limitations of conventional hardware architectures.

The present disclosure addresses the above needs, as well as others, by providing a system and method for use in an IED that performs high resolution waveform capture to generate multi-rate waveform data in real-time. In one embodiment, high-resolution sampled data is dynamically pre-ordered into separate high resolution and low resolution data streams for presentation and storage. This pre-ordering of data is optimized so as to minimize the amount of data manipulation required to prepare the sampled data for eventual presentation and storage in the IED. Pre-ordering of data facilitates minimum performance impact so that continuous real-time data capture can be achieved.

In accordance with one aspect of the present disclosure, data is managed while in process, by utilizing various approaches to minimize buffer size requirements and the number of necessary reads and writes to the available storage devices.

In accordance with another aspect of the present disclosure, the pre-ordering of data is performed on the input (i.e., data reception) side of a CPU/IO processor. In this manner, the CPU/IO processor acts as a data distributor of the pre-ordered sampled data by distributing the pre-ordered data to the available storage devices of the IED. The pre-ordering of the data on an input side of the CPU/IO processor thereby removes the processing load of having to order the data output by the CPU/IO processor. This is a key feature given that the CPU/IO processor cannot handle out of order data efficiently. Specifically, it can not efficiently pick out every certain sample from the output data stream. Pre-ordering the data and leaving the distribution of pre-ordered data to the CPU/IO processor provides efficiencies because the DSP and FPGA are specifically structured to efficiently order data, whereas the CPU/IO suffers a severe performance penalty.

According to yet another aspect of the present disclosure, full bandwidth samples are processed up to the maximum sample rate of the system. The process of pre-ordering the full bandwidth samples, in real time, into two or more data substreams at various data rates is offloaded from the CPU/IO processor so that low sample rate data which is normally interspersed among the high resolution samples are grouped together. By grouping the low sample rate data apart from the high resolution samples, the data can then be stored in permanent storage memory without any further data movement or processing. The accumulation of high resolution samples and low resolution samples occur concurrently, each with an independently settable capture interval to efficiently implement multi-rate concurrent waveform capture and storage within the IED.

BRIEF DESCRIPTION OF THE DRAWINGS

These and other objects, features and advantages of the present disclosure will be apparent from a consideration of the following Detailed Description considered in conjunction with the drawing Figures, in which.

Figure 1:
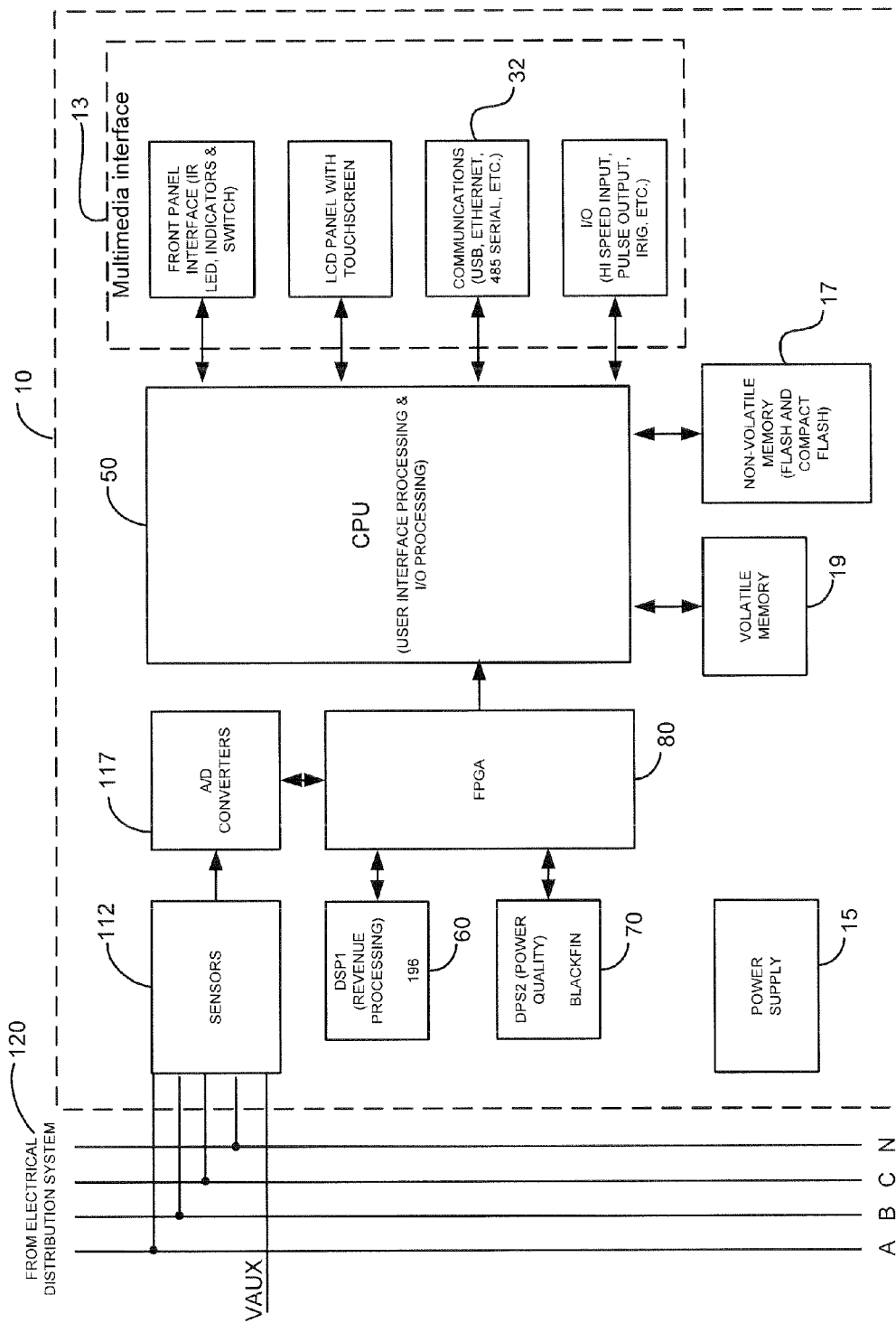
FIG. 1 is a block diagram of an intelligent electronic device (IED) for monitoring and determining power usage and power quality for any metered point within a power distribution system and for providing a data transfer system for faster and more accurate processing of revenue and waveform analysis, according to one embodiment.

To facilitate understanding, identical reference numerals have been used, where possible, to designate identical elements that are common to the figures, except that alphanumerical suffixes may be added, when appropriate, to differentiate such elements. The images in the drawings are simplified for illustrative purposes and are not depicted to scale.

The appended drawings illustrate exemplary embodiments of the present disclosure and, as such, should not be considered as limiting the scope of the disclosure that may admit to other equally effective embodiments. Correspondingly, it has been contemplated that features or steps of one embodiment may beneficially be incorporated in other embodiments without further recitation.

In some embodiments, particular method steps of the discussed methods are performed in the depicted order. In alternate embodiments, in the respective methods, at least two method steps or portions thereof may be performed contemporaneously, in parallel, or in a different order.

DETAILED DESCRIPTION

It should be understood that the elements shown in the figures may be implemented in various forms of hardware, software or combinations thereof. Preferably, these elements are implemented in a combination of hardware and software on one or more appropriately programmed general-purpose devices, which may include a processor, memory and input/output interfaces.

The present description illustrates the principles of the present disclosure. It will thus be appreciated that those skilled in the art will be able to devise various arrangements that, although not explicitly described or shown herein, embody the principles of the disclosure and are included within its spirit and scope.

All examples and conditional language recited herein are intended for pedagogical purposes to aid the reader in understanding the principles of the disclosure and the concepts contributed by the inventor to furthering the art, and are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that the block diagrams presented herein represent conceptual views of illustrative circuitry embodying the principles of the disclosure. Similarly, it will be appreciated that any flow charts, flow diagrams, state transition diagrams, pseudo-code, and the like represent various processes which may be substantially represented in computer readable media and so executed by a computer or processor, whether or not such computer or processor is explicitly shown.

The functions of the various elements shown in the figures may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor ("DSP") hardware, read only memory ("ROM") for storing software, random access memory ("RAM"), and nonvolatile storage.

Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

Aspects of the present disclosure are illustratively described herein within the context of intelligent electronic devices ("IEDs") such as digital electrical power and energy meters, including revenue accuracy certifiable meters. The term "digital electrical power and energy meters" is broadly used herein in reference to IEDs adapted to record, measure, and communicate at least some of supply currents and supply voltages of the respective electrical service, their waveforms, harmonics, transients, and other disturbances, and the corresponding parameters, such as power, power quality, energy, revenue, and the like.

It will be appreciated by those skilled in the art that the disclosure may also be utilized within the context of other IEDs, including Programmable Logic Controllers ("PLC's"), Remote Terminal Units ("RTUs"), protective relays, and fault recorders, among other devices or systems used to manage and control quality, distribution, and consumption of electrical power.

The word "exemplary" is used herein to mean "serving as an example, instance, or illustration." Any configuration or design described herein as "exemplary" is not necessarily to be construed as preferred or advantageous over other configurations or designs. Herein, the phrase "coupled with" is defined to mean directly connected to or indirectly connected with through one or more intermediate components. Such intermediate components may include both hardware and software based components.

I—General Overview of an IED

As used herein, intelligent electronic devices ("IED's") include Programmable Logic Controllers ("PLC's"), Remote Terminal Units ("RTU's"), electric power meters, protective relays, fault recorders and other devices which are coupled with power distribution networks to manage and control the distribution and consumption of electrical power. A meter is a device that records and measures power events, power quality, current, voltage waveforms, harmonics, transients and other power disturbances. Revenue accurate meters ("revenue meter") relate to revenue accuracy electrical power metering devices with the ability to detect, monitor, report, quantify and communicate power quality information about the power that they are metering.

FIG. 1 is a block diagram of an intelligent electronic device (IED) 10 for monitoring and determining power usage and power quality for any metered point within a power distribution system and for providing a data transfer system for faster and more accurate processing of revenue and waveform analysis.

The IED 10 of FIG. 1 includes a plurality of sensors 112 coupled to various phases A, B, C of an electrical distribution system 120, a plurality of analog-to-digital (A/D) converters 117 including inputs coupled to the sensor 112 outputs, a power supply 15, a volatile memory 19, an non-volatile memory 17, a multimedia user interface 13, and a processing system that includes at least one central processing unit (CPU) 50 (or host processor) and one or more digital signal processors, two of which are shown, i.e., DSP1 60 and DSP2 70. The IED 10 also includes a Field Programmable Gate Array 80 which performs a number of functions, including, but not limited to, acting as a communications gateway for routing data between the various processors 50, 60, 70, receiving data from the A/D converters 117 performing transient detection and capture and performing memory decoding for CPU 50 and the DSP processor 60. The FPGA 80 is internally comprised of two dual port memories to facilitate the various functions, as will be described further below.

The plurality of sensors 112 sense electrical parameters, e.g., voltage and current, on incoming lines, (i.e., phase A, phase B, phase C), from an electrical power distribution system.

A/D converters 117 are respectively configured to convert an analog voltage output to a digital signal that is transmitted to a gate array, such as Field Programmable Gate Array (FPGA) 80. The digital signal is then transmitted from the FPGA 80 to the CPU 50 and/or one or more DSP processors 60, 70 to be processed in a manner to be described below.

The CPU 50 or DSP Processors 60, 70 are configured to operatively receive digital signals from the A/D converters 117 (see FIG. 1) to perform calculations necessary to determine power usage and to control the overall operations of the IED 10. In some embodiments, CPU 50, DSP1 60 and DSP2 70 may be combined into a single processor, serving the functions of each component. In some embodiments, it is contemplated to use an Erasable Programmable Logic Device (EPLD) or a Complex Programmable Logic Device (CPLD) or any other programmable logic device in place of the FPGA 80. In some embodiments, the digital samples, which are output from the A/D converters 117 are sent directly to the CPU 50 or DSP processors 60, 70, effectively bypassing the FPGA 80 as a communications gateway.

The power supply 15 provides power to each component of the IED 10. Preferably, the power supply 15 is a transformer with its primary windings coupled to the incoming power distribution lines and having windings to provide a nominal voltage, e.g., 5 VDC, +12 VDC and −12 VDC, at its secondary windings. In other embodiments, power may be supplied from an independent power source to the power supply 15. For example, power may be supplied from a different electrical circuit or an uninterruptible power supply (UPS).

In one embodiment, the power supply 15 can be a switch mode power supply in which the primary AC signal will be converted to a form of DC signal and then switched at high frequency, such as, for example, 100 Khz, and then brought through a transformer to step the primary voltage down to, for example, 5 Volts AC. A rectifier and a regulating circuit would then be used to regulate the voltage and provide a stable DC low voltage output. Other embodiments, such as, but not limited to, linear power supplies or capacitor dividing power supplies are also contemplated.

The multimedia user interface 13 is shown coupled to the CPU 50 in FIG. 1 for interacting with a user and for communicating events, such as alarms and instructions to the user. The multimedia user interface 13 preferably includes a display for providing visual indications to the user. The display may be embodied as a touch screen, a liquid crystal display (LCD), a plurality of LED number segments, individual light bulbs or any combination. The display may provide information to the user in the form of alpha-numeric lines, computer-generated graphics, videos, animations, etc. The multimedia user interface 13 further includes a speaker or audible output means for audibly producing instructions, alarms, data, etc. The speaker is coupled to the CPU 50 via a digital-to-analog converter (D/A) for converting digital audio files stored in a memory 19 or non-volatile memory 17 to analog signals playable by the speaker. An exemplary interface is disclosed and described in commonly owned co-pending U.S. application Ser. No. 11/589,381, entitled "POWER METER HAVING AUDIBLE AND VISUAL INTERFACE", which claims priority to expired U.S. Provisional Patent Appl. No. 60/731,006, filed Oct. 28, 2005, the contents of which are hereby incorporated by reference in their entireties.

The IED 10 will support various file types including but not limited to Microsoft Windows Media Video files (.wmv), Microsoft Photo Story files (.asf), Microsoft Windows Media Audio files (.wma), MP3 audio files (.mp3), JPEG image files (.jpg, .jpeg, .jpe, .jfif), MPEG movie files (.mpeg, .mpg, .mpe, .m1v, .mp2v .mpeg2), Microsoft Recorded TV Show files (.dvr-ms), Microsoft Windows Video files (.avi) and Microsoft Windows Audio files (.wav).

The IED 10 may communicate to a server or other computing device via a communication network. The IED 10 may be connected to a communications network, e.g., the Internet, by any means, for example, a hardwired or wireless connection, such as dial-up, hardwired, cable, DSL, satellite, cellular, PCS, wireless transmission (e.g., 802.11a/b/g), etc. It is to be appreciated that the network may be a local area network (LAN), wide area network (WAN), the Internet or any network that couples a plurality of computers to enable various modes of communication via network messages. Furthermore, the IED 10 will communicate using various protocols such as Transmission Control Protocol/ Internet Protocol (TCP/IP), File Transfer Protocol (FTP), Hypertext Transfer Protocol (HTTP), etc. and secure protocols such as Hypertext Transfer Protocol Secure (HTTPS), Internet Protocol Security Protocol (IPSec), Point-to-Point Tunneling Protocol (PPTP), Secure Sockets Layer (SSL) Protocol, etc.

The IED 10 further comprises a volatile memory 19 and a non-volatile memory 17. In addition to storing audio and/or video files, volatile memory 19 will store the sensed and generated data for further processing and for retrieval when called upon to be displayed at the IED 10 or from a remote location. The volatile memory 19 includes internal storage memory, e.g., random access memory (RAM), or removable memory such as magnetic storage memory; optical storage memory, e.g., the various types of CD and DVD media; solid-state storage memory, e.g., a Compact Flash card, a Memory Stick, Smart Media card, Multimedia Card (MMC), SD (Secure Digital) memory; or any other memory storage that exists currently or will exist in the future. By utilizing removable memory, an IED can be easily upgraded as needed. Such memory will be used for storing historical trends, waveform captures, event logs including time-stamps and stored digital samples for later downloading to a client application, web-server or PC application.

In a further embodiment, the IED 10 will include a communication device 32 for enabling communications between the IED, and a remote terminal unit, programmable logic controller and other computing devices, microprocessors, a desktop computer, laptop computer, other meter modules, etc. The communication device 32 may be a modem, network interface card (NIC), wireless transceiver, etc. The communication device 32 will perform its functionality by hardwired and/or wireless connectivity. The hardwire connection may include but is not limited to hard wire cabling e.g., parallel or serial cables, RS232, RS485, USB cable, Firewire (1394 connectivity) cables, Ethernet, and the appropriate communication port configuration. The wireless connection will operate under any of the various wireless protocols including but not limited to Bluetooth™ interconnectivity, infrared connectivity, radio transmission connectivity including computer digital signal broadcasting and reception commonly referred to as Wi-Fi or 802.11.X (where x denotes the type of transmission), satellite transmission or any other type of communication protocols, communication architecture or systems currently existing or to be developed for wirelessly transmitting data including spread spectrum 900 MHz, or other frequencies, Zigbee, WiFi, or any mesh enabled wireless communication.

In an additional embodiment, the IED 10 will also have the capability of not only digitizing voltage and current waveforms, but storing the waveforms and transferring that data upstream to a central computer, e.g., a remote server, when an event occurs such as a voltage surge or sag or a current short circuit. This data will be triggered and captured on an event, stored to memory, e.g., non-volatile RAM, and additionally transferred to a host computer within the existing communication infrastructure either immediately in response to a request from a remote device or computer to receive said data in response to a polled request. The digitized waveform will also allow the CPU 50 to compute other electrical parameters such as harmonics, magnitudes, symmetrical components and phasor analysis. Using the harmonics, the IED 10 will also calculate dangerous heating conditions and can provide harmonic transformer derating based on harmonics found in the current waveform.

In a further embodiment, the IED 10 will execute an e-mail client and will send e-mails to the utility or to the customer direct on an occasion that a power quality event occurs. This allows utility companies to dispatch crews to repair the condition. The data generated by the meters are use to diagnose the cause of the condition. The data is transferred through the infrastructure created by the electrical power distribution system. The e-mail client will utilize a pop3 or other standard mail protocol. A user will program the outgoing mail server and e-mail address into the meter. An exemplary embodiment of said functionality is disclosed in U.S. Pat. No. 6,751,563, the contents of which are incorporated by reference herein.

The techniques of the present disclosure can be used to automatically maintain program data and provide field wide updates upon which IED firmware and/or software can be upgraded. An event command can be issued by a user, on a schedule or by digital communication that will trigger the IED 10 to access a remote server and obtain the new program code. This will ensure that program data will also be maintained allowing the user to be assured that all information is displayed identically on all units.

It is to be understood that the present disclosure may be implemented in various forms of hardware, software, firmware, special purpose processors, or a combination thereof. The IED 10 also includes an operating system and micro instruction code. The various processes and functions described herein may either be part of the micro instruction code or part of an application program (or a combination thereof) which is executed via the operating system.

It is to be further understood that because some of the constituent system components and method steps depicted in the accompanying figures may be implemented in software, or firmware, the actual connections between the system components (or the process steps) may differ depending upon the manner in which the present disclosure is programmed. Given the teachings of the present disclosure provided herein, one of ordinary skill in the related art will be able to contemplate these and similar implementations or configurations of the present disclosure.

The IED 10 of the present disclosure can compute a calibrated $V_{PN}$ (phase to neutral) or $V_{PP}$ (phase to phase) voltage RMS from $V_{PE}$ (phase to earth) and $V_{NE}$ (neutral to earth) signals sampled relative to the Earth's potential. The desired voltage signal can be produced by subtracting the received channels, for example the phase to neutral voltage $V_{PN}=V_{PE}-V_{NE}$. Calibration involves removing (by adding or subtracting) an offset (o, p) and scaling (multiplying or dividing) by a gain (g, h) to produce a sampled signal congruent with the original input signal.

RMS is the Root-Mean-Square value of a signal, the square root of an arithmetic mean (average of n values) of squared values. Properly combined, one representation of this formula is:

$$V_{AN} = \sqrt{\frac{\sum_n (g(V_{AE} - o) - h(V_{NE} - p))^2}{n}}$$

where $V_{AN}$ is the voltage measured from phase A to neutral, $V_{AE}$ is the voltage measured from phase A to earth and $V_{NE}$ is the voltage measured from neutral to earth.

Implementation of the computation in this arrangement is comparatively inefficient, in that many computations involving constants (−o, −p, g, h) are performed n times, and that computational precision can either be minimized, forcing the use of large numbers (requiring increased memory for storage and increased time to manipulate), or be degraded, increasing the uncertainty. However, a mathematical rearrangement can be carried out on the above formula, producing an equivalent computation that can be carried out more efficiently, decreasing the effort needed to produce similar or superior results. That representation is:

$$V_{AN} = \sqrt{g^2\left(\frac{\sum_n V_{AE}^2 - 2o\sum_n V_{AE}}{n} + o^2\right) - 2gh\left(\frac{\sum_n V_{AE}V_{NE} - o\sum_n V_{NE} - p\sum_n V_{AE}}{n} + op\right) + h^2\left(\frac{\sum_n V_{NE}^2 - 2p\sum_n V_{NE}}{n} + p^2\right)}$$

where $V_{AN}$ is the voltage measured from phase A to neutral, $V_{AE}$ is the voltage measured from phase A to earth and $V_{NE}$ is the voltage measured from neutral to earth.

Implementation of the computation in this arrangement can be accomplished with more efficiency and precision. All involvement of constants has been shifted to single steps, removed from the need to be applied n times each. This savings in computation can then be partially utilized to perform slower but more precise applications of the gains and Square Root. The result is a value of equal or higher precision in equal or lesser time.

These calculations are preferably implemented in software by at least one processor such as the CPU 50 or, in the alternative, by at least one DSP Processor 70 and at least one FPGA 80.

II. Overview

Systems and methods are provided for performing waveform capture in real time by dynamically pre-ordering a waveform capture of a high-resolution sampled data stream into low and high resolution streams. The two streams are formed concurrently and independently providing multi-rate concurrent waveform capture, storage and presentation for power quality metering. By creating separate high and low resolution streams, the degree of subsequent data manipulation required to prepare the data for eventual storage in the available storage devices of an IED is minimized. In this manner, the dynamic pre-ordering constitutes a form of data optimization.

To achieve the objectives of the present disclosure, partitioning of processing tasks among the different hardware elements has been optimized to support the pre-ordering of data in real-time. In addition, various data management techniques are utilized, such as managing data while in process, to minimize buffer size requirements and managing the number of necessary reads and writes to the memory buffers. The data management techniques described herein overcomes processing and storage inefficiencies associated with pooling data into a single large buffer.

III. High Resolution Waveform Capture

Figure 2:
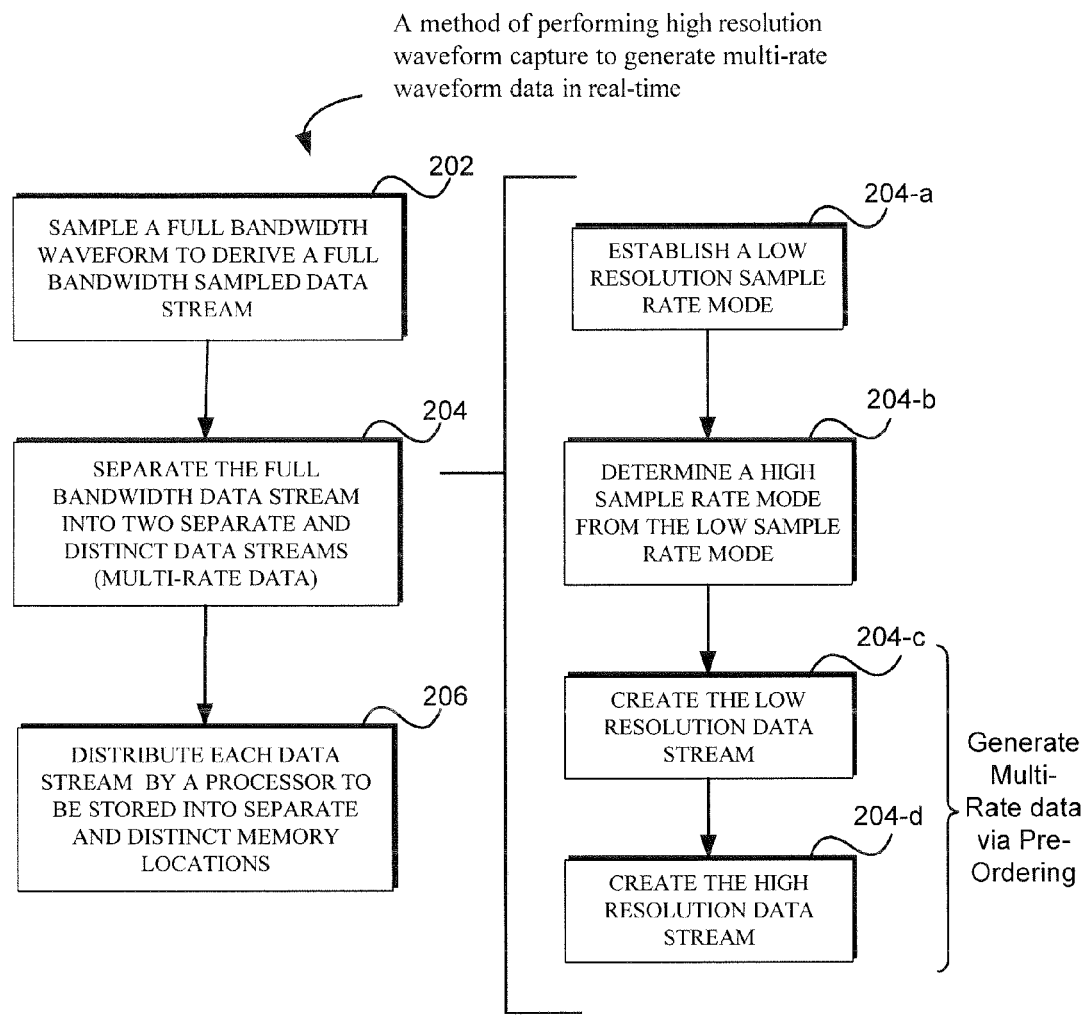
FIG. 2 illustrates an exemplary method of performing high resolution waveform capture to create multi-rate waveform data in real-time in accordance with an embodiment of the present disclosure.

FIG. 2 illustrates, generally, an exemplary method of performing high resolution waveform capture to create multi-rate waveform data in real-time in accordance with embodiments of the present disclosure.

A process of creating multi-rate waveform data from a high resolution waveform capture begins with the sampling of a full bandwidth waveform to derive a full bandwidth sampled data stream sampled at some sampling rate (e.g., 1024 samples/cycle) (step 202). It is understood that the selected sample rate of 1024 samples/cycle is by way of example only. In other embodiments, the sample rate can be any sample rate sufficient to sample a three phase power source (e.g., 2048 samples/cycle, 4096 samples/cycle).

With continued reference to FIG. 2, the full bandwidth sampled data stream is then separated into multi-rate waveform data, (i.e., two separate and distinct data streams comprising a low resolution data stream and high resolution data stream) (step 204). This step of separating the data stream into multi-rate waveform data represents a key feature of the disclosure. That is, the separation of the data stream into multi-rate waveform data provides the user with the flexibility for optimum data capture and presentation for different power quality events. The present disclosure provides processing and storage efficiencies by dynamically pre-ordering data on the input side of CPU. By dynamically pre-ordering data in a manner to be described, a processing burden on CPU is removed in that its only function is to distribute the pre-ordered data to the available storage devices without further processing, as described at step 206. Each data stream of the multirate waveform data is then distributed by a CPU processor into separate memory locations (step 206).

The step of separating the data stream into multi-rate waveform data further comprises performing sub-steps 204-*a* through 204-*d*, described as follows.

First, a low resolution sample rate mode is established (step 204-*a*). Next, a high resolution sample rate mode is determined from the previously established low resolution sample rate mode as some integer multiple of the low sample rate mode (step 204-*b*). Some non-limiting examples of the establishment of low/high sample rate modes are: (high/low)={2048/1024, 2048/512, 2048/256, 1024/512, 1024/512, 1024/256. 1024/128, 512/256, 512/128, 512/64}.

It should be understood that irrespective of the particular multi-rate sample rate modes selected, both the high and low data streams are created directly from the sampled full bandwidth 1024 sample/cycle data stream for eventual presentation and storage.

A process by which the sampled full bandwidth 1024 sample/cycle data stream is separated into multi-rate data is referred to herein as dynamic pre-ordering. In the described embodiments, this process of dynamic pre-ordering sampled data is performed on the input side of a processor, which can be a CPU processor.

With continued reference to FIG. 2, having established the low and high sample rate modes at steps 204-a and 204-b, multi-rate waveform capture is created via the creation of a low resolution data stream (204-c) and a high resolution stream (204-d).

The creation of a low resolution data stream may be implemented differently according to various embodiments of the present disclosure, two of which are described as follows.

Creating a Low Resolution Data Stream Via Data Extraction

In one embodiment, the low resolution data stream is created at step 204-c by a process of extraction. Assume, for example, that the desired multi-rate (high/low) data stream rates to be created are 1024/128, having a respective ratio of 8:1. To create a 128 sample/sec low resolution data stream, every eighth data point is extracted from the sampled full bandwidth 1024 sample/cycle data stream to be separately stored in a Dual Port memory. Once extracted, these data points are separately stored in a dedicated memory.

Thereafter, once all of the data points have been extracted, the remaining (un-extracted) data points are separately stored in a different dedicated memory as the high resolution data stream, as described above with reference to step 204-d. In this embodiment, it should be understood that the stored high resolution data stream is missing the extracted data points. However, the high resolution data stream can be restored to its original form by simply re-inserting the previously extracted data points when needed (i.e., upon a trigger event). It is to be understood that when the extracted data points are re-inserted (restored) upon the occurrence of a trigger event, the high resolution data stream is identical to the originally sampled full bandwidth 1024 sample/cycle data stream.

Restoration comprises re-inserting the lower sample rate data from the previously stored low resolution data stream into the high resolution data stream in a corrected time order. This restoration may be performed, for example, on playback when using a log viewer or at other times convenient to the user. Further, it should be appreciated that restoration of the higher and/or lower sample rate data does not have to be performed in real-time, thereby optimizing the performance of the embedded system.

Creating a Low Resolution Data Stream Via Data Copying

In one embodiment, the low resolution data stream is created at step 204-c by a process of copying. Assume, for example, that the desired multi-rate (high/low) data stream rates to be created are 1024/128, having a respective ratio of 8:1. Similar to that described above, every eighth data point is now copied from the sampled full bandwidth 1024 sample/cycle data stream to be separately stored in a dedicated memory.

Thereafter, once all of the low resolution data points are copied from the Dual Port memory, all of the data points from the full bandwidth 1024 sample/cycle data stream are copied from Dual Port memory to be separately stored in a dedicated memory as the high resolution data stream. It is noted that, in contrast to the extraction embodiment described above, in the presently described (copying) embodiment, the high resolution data stream is not missing any data points by virtue of the fact that data points have been copied and not extracted. This results in two complete sets of data points, one for high resolution data and one for low resolution data).

Figure 10:
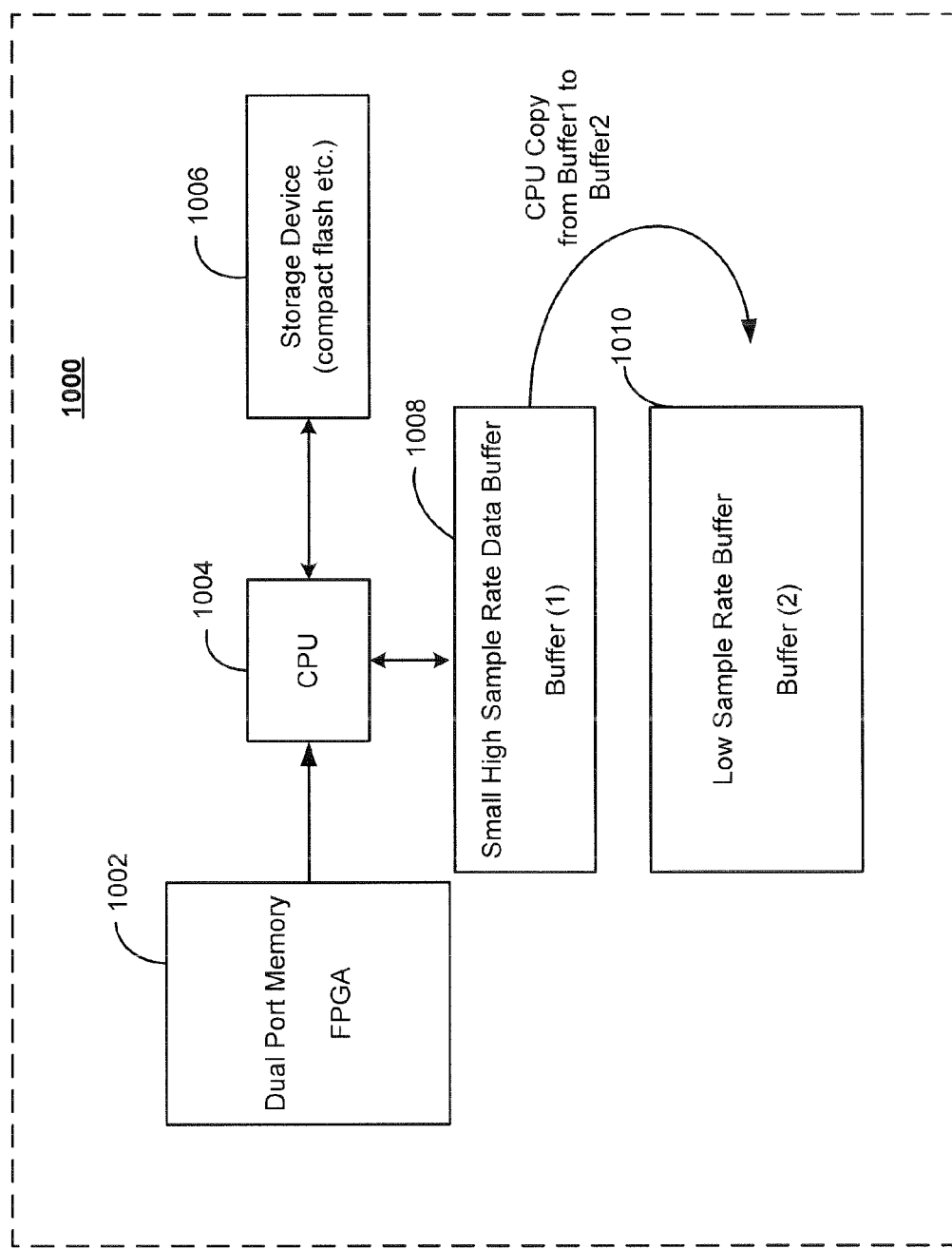
FIG. 10 illustrates a second exemplary memory allocation scheme, according to an embodiment of the present disclosure.

Alternatively, with reference now to FIG. 10, all the full bandwidth data is copied into the high resolution buffer 1008 from the DPM 1002 first and thereafter the low resolution data samples are read out from this buffer 1008 and placed in a separate buffer memory 1010. In other words, the low resolution data is read from the high resolution buffer and not the DPM.

Trigger Events

In the described embodiments, multi-rate waveform data created in accordance with the methods taught herein is separately stored in dedicated memories and is only reconstituted for presentation upon the occurrence of a trigger event. Trigger events are well known and may include, for example, a transient voltage spike or a sag or swell in the RMS voltage, any of which (or combinations thereof) may occur while sampling the full bandwidth sampled waveform (e.g., at 2048, 1024 or any other sampling rate).

When a trigger event occurs, the IED can be set up to trigger a capture of sample data points of the trigger event to a log file. It is understood that the log file to which the sample data points are written may be different for different events. That is, log files are dedicated for use with different types of trigger events (e.g., transient captures, sag/swell captures). For example, transient events are captured at the full bandwidth sampling rate while a sag/swell event may be captured at a programmable rate which may be of lower resolution.

The events that trigger a high resolution capture are usually independent of events that trigger a low resolution capture, that is, they have separate triggers; however, both events could happen simultaneously. In conventional usage, whenever multiple trigger events occurs, both a low sample rate data stream and a high sample rate data stream are constructed substantially simultaneously, requiring intensive computations to be performed by a CPU processor, for example, or other processing device. The computations performed by the CPU processor undesirably result in a data storage time problem requiring that the CPU first calculate the location of each low resolution sample and then read it and form a low resolution capture by putting the data into a buffer and then writing it to storage. The low resolution samples are spread across the entirety of full bandwidth samples. Without performing any grouping operation, CPU's processing execution time and resources become overburdened resulting in an inability to meet the real-time requirements of the meter. Therefore, it is desirable to offload the task of gathering and grouping the low resolution samples from among the full bandwidth 1024 sample/cycle data stream from CPU. Offloading this task from CPU optimizes performance and data storage time so that for low sample rate data, it is possible to achieve continuous recording of data if the trigger conditions are continuously met. For example, for an IED set to perform 3 seconds of low resolution capture upon the occurrence of a sag/swell event, continuous recording may occur if the next sag/swell event occurs within the 3 second window of the current sag/swell event. Also, the IED may be configured to perform continuous capturing upon the occurrence of an initial (first) sag/swell event.

First Embodiment

Figure 3:
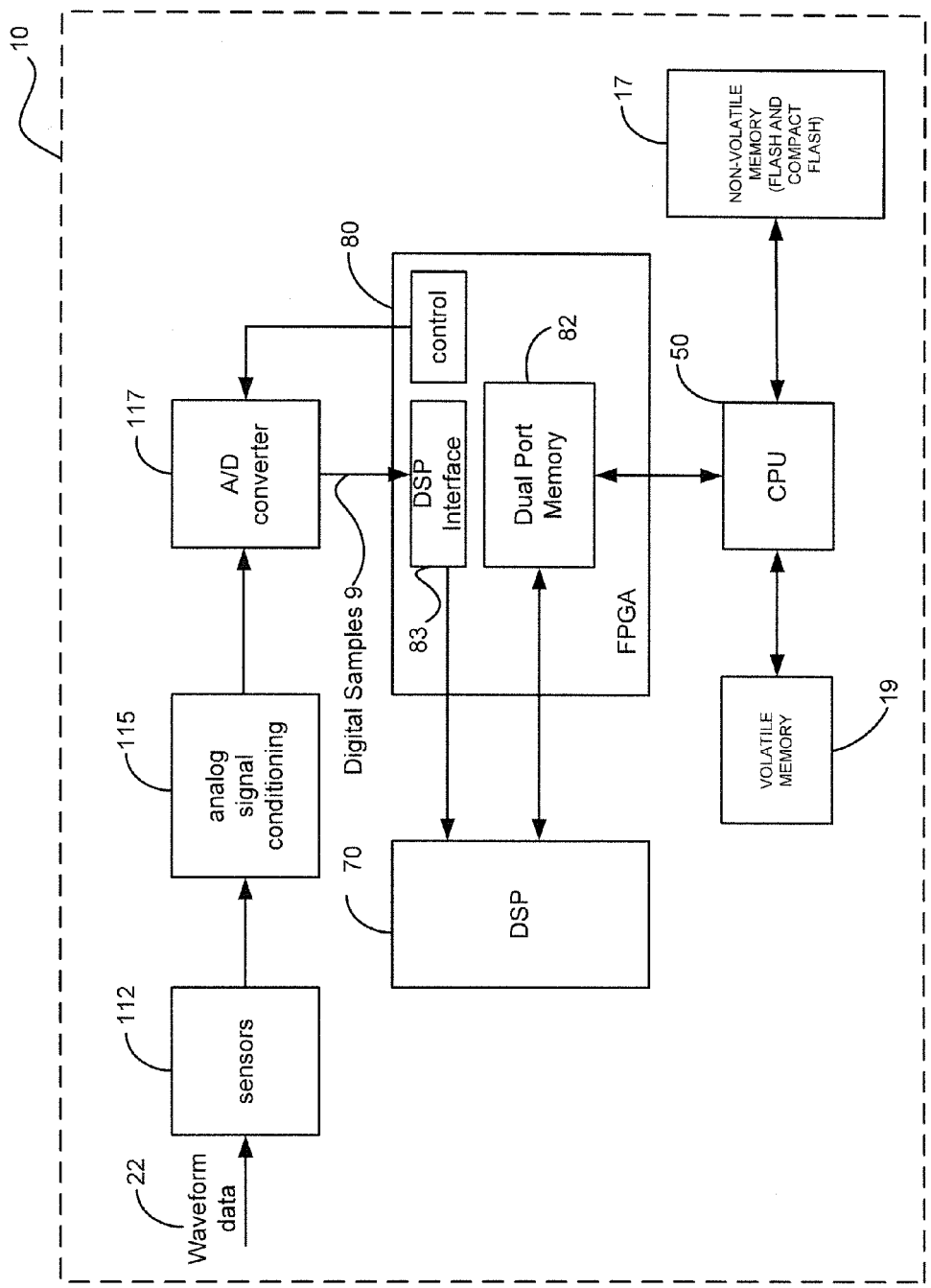
FIG. 3 illustrates a hardware architecture using an FPGA (or PLD) to control the sampling of waveform data, according to one embodiment.

FIG. 3 illustrates a hardware architecture using an FPGA 80 (or PLD) to control the sampling of waveform data 22, according to one embodiment. Control of the sampling of waveform data 22 by FPGA 80 begins with FPGA 80 commanding the A/D converters 117 by commanding the start of the A/D conversion at a periodic rate which it controls. Thereafter, FPGA 80 checks to see if the A/D converters have finished the conversion. Once FPGA 80 determines the A/D conversion is complete, it reads the data out of the A/D converters 117 and sends the converted data to the DSP 70 for processing. It is understood that the DSP 70 is a passive participant in this process in the sense that it waits for the data to be converted by the A/D converters 117 and accepts the converted data under control of FPGA 80. The converted data is processed in the DSP 70. Processing may comprise, without limitation, calculating RMS values, power, energy and the like. In an embodiment, processing is performed on a frame by frame basis by DSP 70. Each frame may represent, for example, a quarter cycle or half cycle of data processed by DSP 70. DSP 70 writes each frame of processed data to Dual Port Memory 82.

In one embodiment to be described below, as data is written into Dual Port Memory 82, FPGA 80 intervenes by remapping the data to write it to Dual Port Memory 82 as pre-ordered data. This process is described below as to the second embodiment in view of FIG. 4.

In another embodiment, to be described below, data is written into Dual Port Memory 82 as originally sampled. However, as the data is read from the DPM 82 by CPU 50, it is remapped by FPGA 80 to create pre-ordered data. This process is described below as the third embodiment in view of FIG. 6.

In yet another embodiment to be described below, as data is written into Dual Port Memory 82, the DSP 70 remaps the data so that it is written into Dual Port Memory 82 as pre-ordered data.

Dual Port Memory

By virtue of its structure, Dual Port Memory 82 allows access to its memory by both DSP 70 and CPU 50 so that Dual Port Memory 82 acts as a communication hub between DSP 70 and CPU 50. CPU 50 is therefore able to read the frame of processed data that was created by DSP 70 for further processing, presentation and storage. Dual Port memory is split into two zones by either FPGA or DSP. One zone is dedicated to low resolution data and the other zone is dedicated to high or full bandwidth data. It is understood that other memory types other than a dual port memory are suitable for use with the presently described hardware architecture. The use of a dual port memory arrangement, or other memory types that are suitable memory arrangements, is well understood by those of ordinary skill in the art.

Second Embodiment

Figure 4:
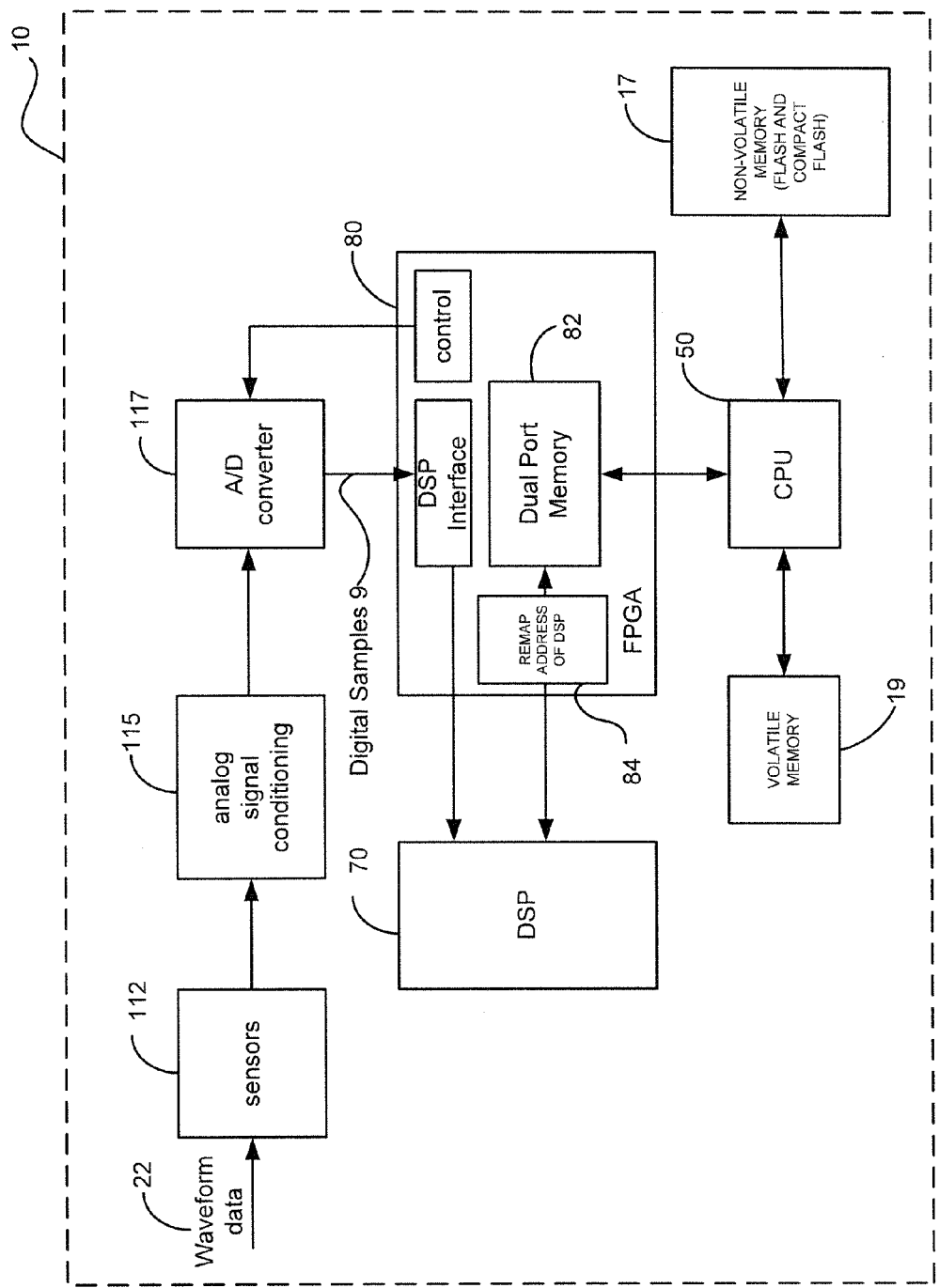
FIG. 4 illustrates a hardware architecture for pre-ordering data that has been processed by a DSP prior to the data being written to a Dual Port Memory, according to one embodiment.

FIG. 4 illustrates a hardware architecture for pre-ordering data processed by DSP 70 prior to the data being written to Dual Port Memory 82. In this embodiment, as processed data is attempted to be written into Dual Port Memory 82 under control of the DSP 70, FPGA 80 intervenes in the write attempt by remapping the data to create pre-ordered data prior to the write operations into Dual Port Memory 82 via a remap address portion 84.

Once written into Dual Port Memory 82, the pre-ordered data is then sequentially read out from Dual Port Memory 82 by CPU 50 without requiring CPU 50 to perform address calculations or special data movements on a sample by sample basis by virtue of the data being pre-ordered by FPGA 80 prior to the write attempts by DSP 70, as described above. Thus, a significant savings in processing time is realized. In accordance with this embodiment, CPU 50 advantageously operates on groups of data which have been pre-ordered by virtue of a remapping performed by FPGA 80.

Figure 5:
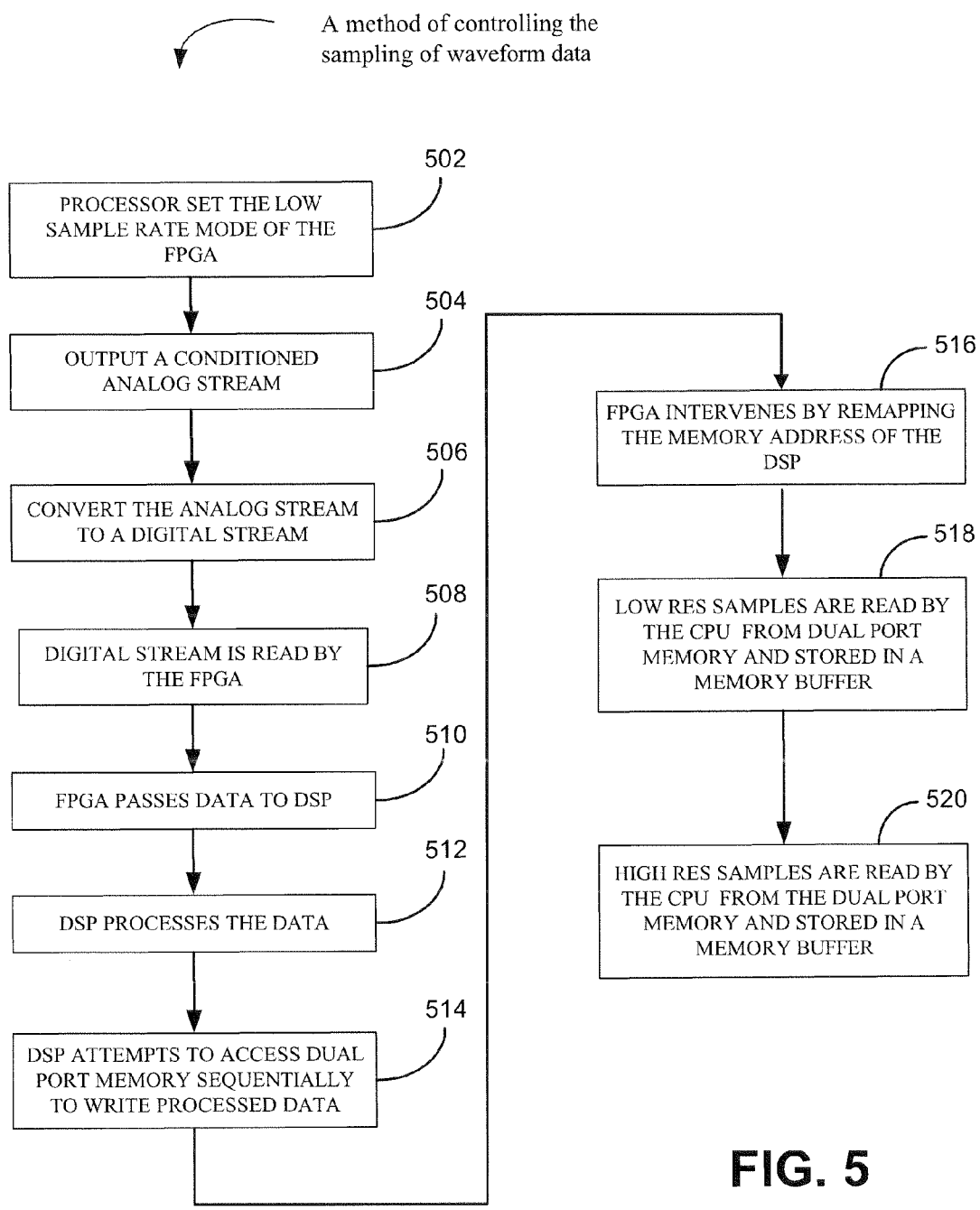
FIG. 5 is a flowchart illustrating method steps for dynamically pre-ordering data under control of an FPGA, according to one embodiment.

FIG. 5 is a flowchart illustrating method steps for dynamically pre-ordering data under control of FPGA 80, according to the presently described exemplary embodiment. In this embodiment, it is understood that the described operations are repeated every quarter cycle, only by way of example. It is understood that in other embodiments, the operations can be repeated using different periods of operation, such as, for example, repeating operations every half cycle.

In operation, to dynamically pre-order DSP processed data under control of FPGA 80, first CPU 50 sets the LOW sample rate mode of FPGA 80. In response, FPGA 80 adjusts its remapping so that CPU 50 first reads the correct number of low resolution samples from the dual-port memory 82 in a desired ratio to the high resolution samples (step 502). It is assumed that waveform data 22 representative of a three phase power source is available to be sensed by sensor 112 and conditioned by analog signal conditioning module 115 which outputs a conditioned analog data stream (step 504). The analog data stream is converted by A/D converter 117 to digital signals 9 (step 506). The digitized sampled signals 9 may then be read by FPGA 80 (step 508). In one embodiment, FPGA 80 is a Field Programmable Gate Array which controls A/D converter 117 and passes the data it reads to DSP 70 (step 510). DSP 70 operates on the digitized input signals (step 512). Processing may include RMS calculations, Power, Apparent Power (VA), Reactive Power (VAR), Power Factor, Harmonic Distortion and Flicker. DSP 70 attempts to access Dual Port Memory 82 to sequentially write the processed data (step 514). However, the attempt is circumvented by FPGA 80. Specifically, before the sequential access can be performed by DSP 70, FPGA 80, programmed to manage the operations of CPU 50, remaps the memory address of CPU 50 (step 516). Remapping is defined in detail further below. The process continues with the Low resolution samples being read by CPU 50 from Dual Port Memory 82 and stored in a memory buffer (step 518). Next, the high resolution samples are read by CPU 50 and stored in a memory buffer (step 520).

The low rate samples are continuously accumulated frame by frame from Dual Port Memory 82 for a user specified buffer length in memory buffer 210 of CPU which is typically specified on the order of seconds or longer until for example a Surge/Sag trigger event occurs at which point the accumulated low rate samples can be directly permanently stored in a storage device such as a compact flash 212 from the memory buffer 210 of CPU in which the low resolution samples have been accumulating.

Third Embodiment

Figure 6:
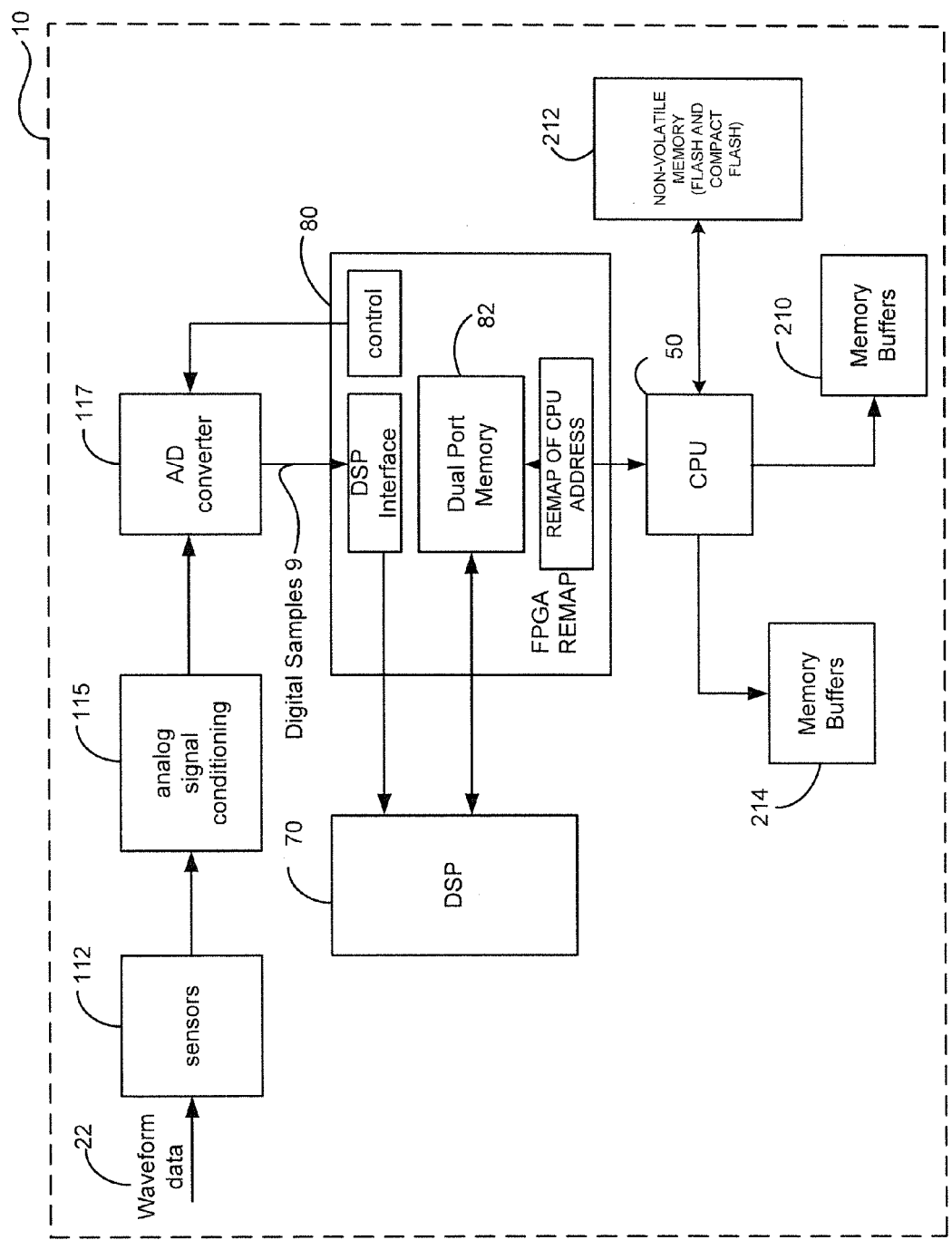
FIG. 6 illustrates a hardware configuration where an FPGA (or PLD) controls the sampling of waveform data, according to another embodiment.

FIG. 6 illustrates a hardware configuration where FPGA 80 (or PLD) controls the sampling of waveform data 22. FIG. 6 further illustrates those operations associated with FPGA 80 (or PLD) controlling the pre-ordering of data as data is being read from Dual Port Memory 82.

In this embodiment, data is written into Dual Port Memory 82 as non pre-ordered data. However, as the data is read out by CPU 50 from DPM 82 it is remapped by FPGA 80 to create pre-ordered data.

The process of pre-ordering data is performed dynamically by FPGA 80 in the sense that FPGA 80 pre-orders data by remapping the read operations as CPU 50 reads data frames from Dual Port Memory 82.

Figure 7:
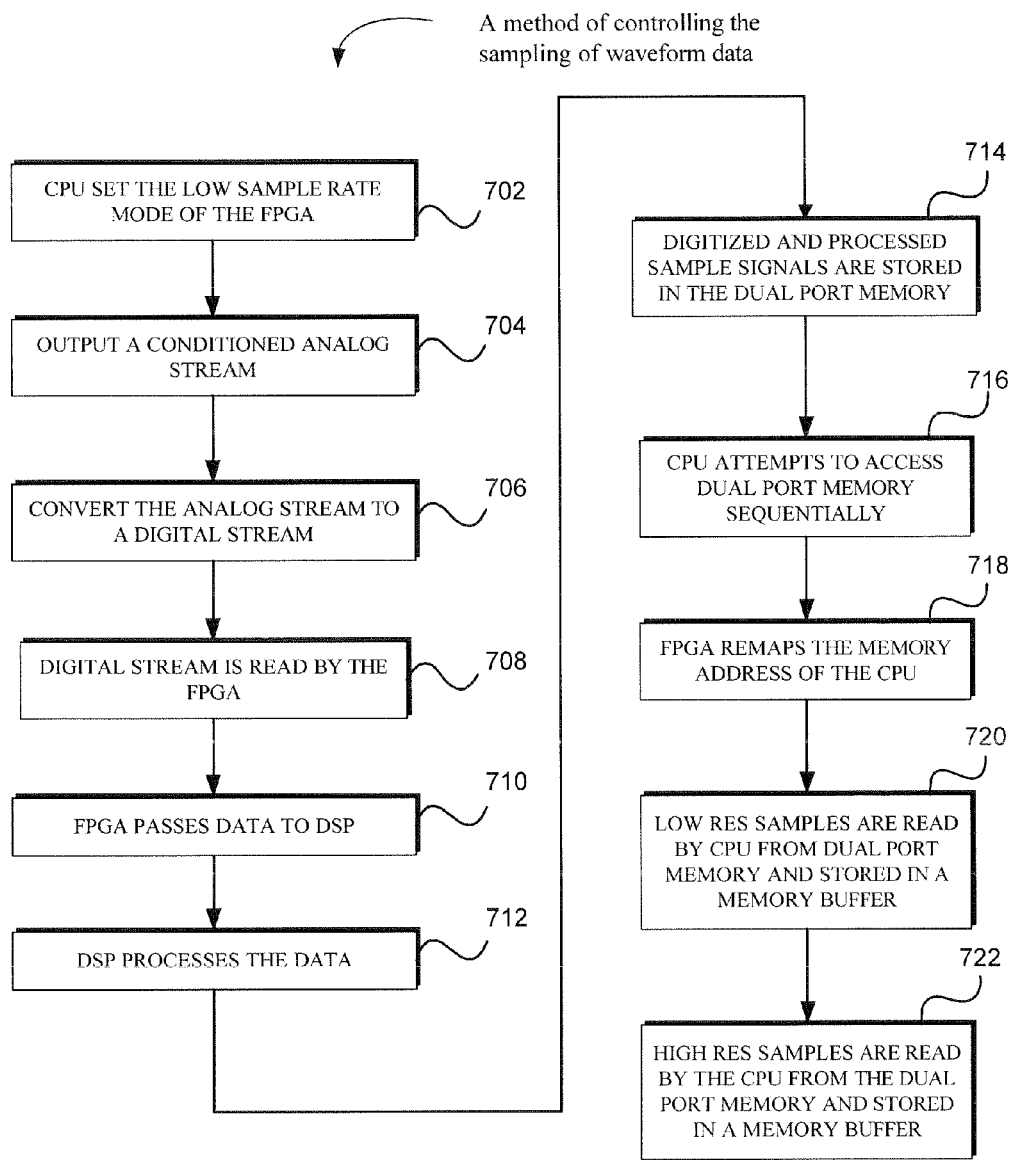
FIG. 7 is a flow chart illustrating method steps for dynamically pre-ordering data under control of an FPGA, according to another embodiment of the present disclosure.

FIG. 7 is a flowchart illustrating method steps for dynamically pre-ordering data under control of FPGA 80 in accordance with this embodiment. In the presently described exemplary embodiment, the operations are repeated, by way of example, every quarter-cycle. However, it is to be understood that in other embodiments, the operations can be repeated using different time periods, such as, for example, every half cycle.

In operation, to dynamically pre-order DSP processed data under control of FPGA 80, first CPU 50 sets the low sample rate mode of FPGA 80. In response, FPGA 80 adjusts its remapping so that CPU 50 first reads the correct number of low resolution samples from the dual-port memory 82 in a desired ratio to the high resolution samples (step 702). It is assumed that waveform data 22 representative of a three phase power source is available to be sensed by sensor 112 and conditioned by analog signal conditioning module 115 which outputs a conditioned analog data stream (step 704). The analog data stream is converted by A/D converter 117 to digital signals (step 706). The digitized sampled signals 9 may then be read by FPGA 80 (step 708). In one embodiment, FPGA 80 is a Field Programmable Gate Array which controls A/D converter 117 and passes the data it reads to DSP 70. (step 710). DSP 70 operates on the digitized input signals 9 (step 712). Processing may include RMS calculations, Power, Apparent Power (VA), Reactive Power (VAR), Power Factor, Harmonic Distortion and Flicker. The digitized and processed sample signals are then stored in the dual-port memory 82 (step 714). Next, CPU 50 attempts to access dual-port memory 82 sequentially (step 716). However, the attempt is circumvented. Specifically, before the sequential access can be performed by CPU 50, FPGA 80 (programmed to manage the operations of CPU 50) remaps the memory address of CPU 50 (step 718). Remapping causes CPU 50 to first read the low rate samples from among the stored digitized and stored sample signals in Dual Port Memory 82 in a selective manner before reading a single high rate sample. Remapping is defined in more detail further below. The low resolution samples are read by CPU 50 from the dual-port memory 82 and are stored in memory buffer 210 (step 720). Next, the high resolution samples are read from dual-port memory 82 by CPU 50 and stored in memory buffer 214 (step 722).

The low rate samples are continuously accumulated frame by frame from Dual Port Memory 82 for the user specified buffer length in memory buffer 210 of CPU which is typically specified on the order of seconds or longer until for example a Surge/Sag trigger event occurs at which point the accumulated low rate samples can be directly permanently stored in a storage device such as a compact flash 212 from the memory buffer 210 of CPU in which the low resolution samples have been accumulating.

The process of segregating the low resolution samples from the high resolution samples, by storing them to a separate dedicated memory, is referred to herein as pre-ordering the data. Pre-ordering is transparent to CPU 50 and involves no processing overhead because the pre-ordering occurs on an input side of CPU 50.

Re-Mapping

Remapping, briefly described above, is performed by FPGA 80 under control of CPU 50 which sets registers in FPGA 80 to control the multiplexing of the addresses as a function of a desired low resolution sample rate selected by a user. In general, CPU 50 sets registers in FPGA 80 such that the multiplexing of addresses for accessing Dual Port Memory corresponds to the access of the low resolution samples before a single high resolution sample is accessed from Dual Port Memory. By way of example, assume that a user defines a desired capture ratio of 8:1, i.e., high to low resolution samples. In other words, the user desires that the low resolution sample rate is $1/8^{th}$ of the high resolution sample rate. In response, CPU 50 sets (adjusts) the low sample rate mode of FPGA 80 to 8:1.

Figure 8:
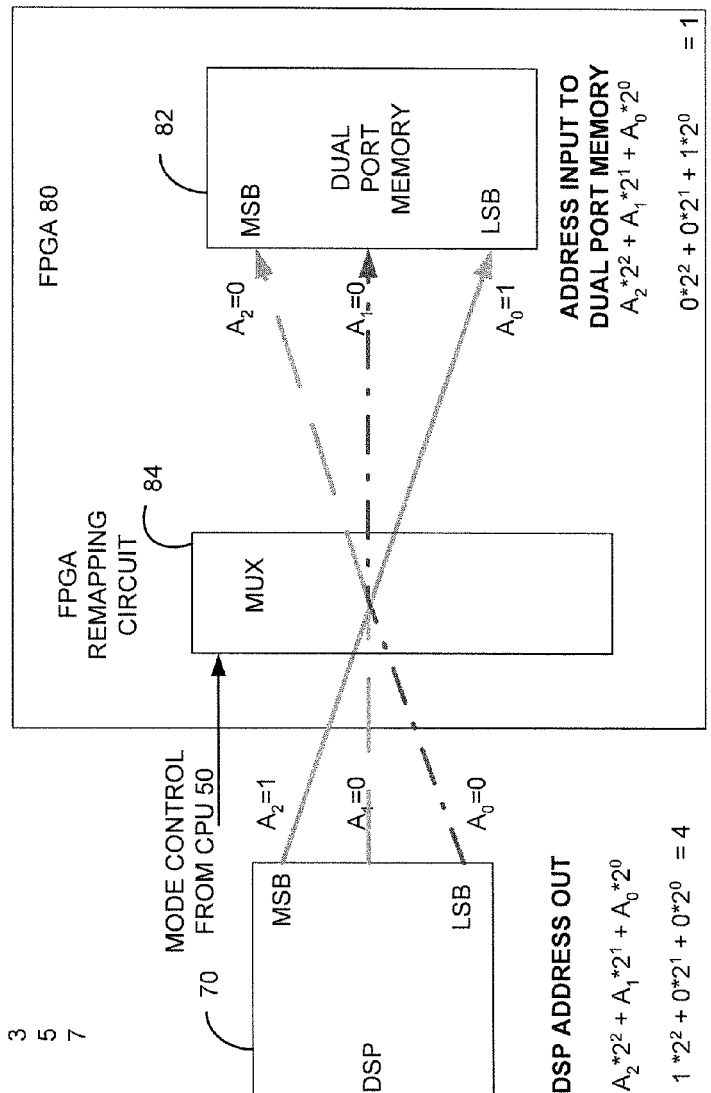
FIG. 8 illustrates (2:1) remapping operation performed by an FPGA remapping circuit which is an element of an FPGA under control of a CPU which sets registers in the FPGA to control the multiplexing of the addresses as a function of a desired LOW resolution sample rate selected by a user, according to one embodiment.

FIG. 8 illustrates, by way of example, a (2:1) remapping operation performed by an FPGA remapping circuit 84 which is an element of FPGA 80 under control of CPU 50 which sets registers in FPGA 80 to control the multiplexing of the addresses as a function of a desired low resolution sample rate selected by a user. The example is simplified for an implementation having only three address bits $A_2$, $A_1$ and $A_o$ from the DSP. FPGA remapping circuit 84 remaps an output address of DSP 70 to an input address of Dual Port Memory 82. In the example shown, an output binary address of $\{1,0,0\}$ corresponding to an integer value of 4 is remapped to an input address of $\{0,0,1\}$ corresponding to an integer value of 1. It is shown by way of example that the remapping operation involves remapping or multiplexing the addresses of DSP 70 so that all address bits from $A_0$ and above are shifted by one position ($2=2^1$) which is the result obtained when multiplying a binary number by two. While the LSB address bits are shifted up, the MSB address bit is rotated into the LSB position. The full sequence of the address bits for a quarter cycle frame of samples coming from DSP 70 as seen by DPM 82 requires eight address bits which will be in the following order $A_6$, $A_5$, $A_4$, $A_3$, $A_2$, $A_1$, $A_0$, $A_7$ for a 2:1 capture ratio. This is performed via a multiplexer implemented within FPGA 80. For the 8:1 capture ration ($8=2^3$) all the address bits from $A_0$ and above are shifted by three bit positions over (which is the results when a binary number is multiplied by 8), with the MSB address bits rotating into the LSB positions. The full sequence of the address bits for 8:1 as seen by DPM 82 is therefore $A_4, A_3, A_2, A_1, A_0, A_7, A_6, A_5$) where $A_4$ is the MSB and $A_5$ is the LSB.

It has therefore been shown that FPGA 80 re-mapping of the sampled data accessed by CPU 50 is a function of a user defined desired low resolution sample rate. CPU 50 sets the low sample rate mode of FPGA 80 and FPGA 80 sets (adjusts) its remapping so that it first reads all of the low resolution samples from the dual-port memory 82 in a desired ratio to the high resolution sample rate.

By way of example, to construct two multi-rate data streams in a desired ratio of 8:1, each time CPU 50 increments by one address to attempt to access the next sample from Dual Port memory, the addressing operation is circumvented in satisfaction of a remapping operation performed by FPGA 80 to its internal Dual Port Memory 82. In other words, the remapping operation trumps the addressing operation each time.

Remapping comprises FPGA 80 creating alternate physical addresses directed to the internal dual port memory 82. The physical addresses are alternate address in the sense that they are used in lieu of sequential addresses attempted to be implemented by CPU 50, but circumvented by FPGA 80 in its remapping operations. Each alternate addresses created by FPGA 80 is a multiple of a sequential address attempted to be implemented by CPU 50. For ease of explanation, this multiple can be expressed as a ratio. For example, the ratio can be 16:1, 8:1, 4:1, and 2:1. Using an exemplary ratio of 8:1 to further describe remapping, the first number of the ratio, 8 corresponds to a high resolution data stream sampled at 1024 samples/cycle and the second number of the ratio 1 corresponds to a low resolution data stream sampled at 128 samples/cycle. Hence the ratio 8:1. In this example, every eighth sample stored in the dual-port memory 82 is effectively a single data point of a low resolution data stream capture (i.e., the low resolution 128 samples/cycle stream).

Third Embodiment

According to the present embodiment, data samples are seamlessly reordered under control of a DSP 70 or secondary processor. In this embodiment, the DSP writes pre-ordered data samples to Dual Port memory without intervention (i.e., remapping) by FPGA. Pre-ordering data under control of the DSP provides a cost effective solution since it already exists in the hardware architecture performing power quality and revenue calculations. Therefore, the additionally functionality of controlling the pre-ordering of waveform data comes at no added cost. The DSP efficiently performs the pre-ordering because of its inherent powerful DMA capabilities which are needed to support digital signal processing algorithms that it must perform.

With reference again to FIG. 3, the hardware architecture comprises an analog front end which is controlled by a programmable logic device such as an FPGA or directly by the DSP to control the sampling of the waveforms, as described above. The DSP 70 reads the samples either directly from the A/D of the analog section or via FPGA DSP Interface logic 83. The DSP processes the samples in its internal buffers to calculate power quality. When it has completed its calculations, it writes the results pre-ordered to FPGA Dual Port Memory 82 or in other embodiments to a discrete dual port memory device or ping-pong memory or FIFO (First In First Out) memory using its powerful DMA engine. The samples are pre-ordered under control of DSP 70 so that the low sample rate data is blocked together. It should be appreciated that in the present embodiment, FPGA does not need to perform a remapping to pre-order the data, as taught in the immediately preceding embodiment. By pre-ordering the data, under control of the DSP 70 as it is written into Dual Port Memory 82, CPU 50 is able to sequentially read the pre-ordered data from Dual Port Memory 82 without having to do any further processing.

In one embodiment, DSP 70 can be configured as part of FPGA 80 so that the processing of data and pre-ordering of data is performed within FPGA 80.

In the present embodiment, a low sample rate data block is first read out from Dual Port Memory 82 by CPU 50 followed by reading the remaining samples which define a high resolution data block. When the trigger conditions are met for either the low and/or high sample rate data, the data can be transferred from Dual Port Memory 82 to be directly stored to a permanent storage device and support continuous real-time recording of data.

It should be understood that high resolution and low resolution samples are accumulated substantially concurrently as independent processes. More particularly, the accumulation of high resolution samples occurs at a high rate but with a very limited time interval while at the same time low resolution data is accumulated at a much slower rate but over a much greater interval of time. This longer interval of time allows the IED to easily support the capture and storage of low resolution waveforms continuously in real-time.

Memory Utilization

According to one aspect of the present disclosure, memory utilization directly impacts both system performance and system resources. Memory utilization entails various aspects including the way memory is accessed and allocated once the samples have been captured in the process described above.

Memory may be accessed and allocated in a number of different ways, some of which are described in the following embodiments.

First Memory Allocation Scheme

Figure 9:
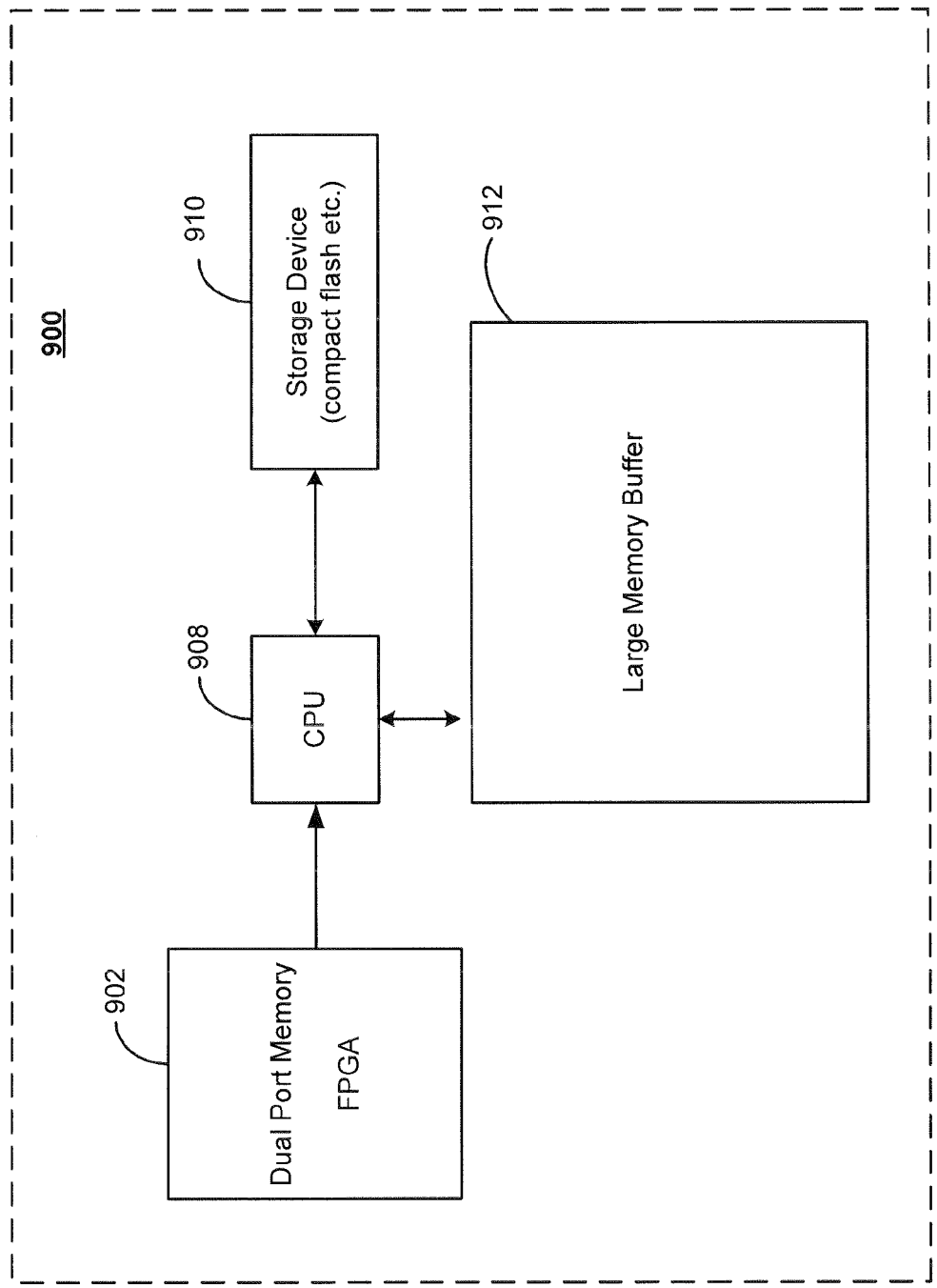
FIG. 9 illustrates a first exemplary memory allocation scheme, according to an embodiment of the present disclosure.

Referring now to FIG. 9, there is shown a first exemplary memory allocation scheme 900, according to one embodiment. Recall from the description above that data is read by the CPU 908 from the dual port memory 902 to the large memory buffer 912.

In the presently described embodiment, it is assumed, by way of example, that the high sample rate is 1024 samples/cycle where each sample is two bytes. It is further assumed that the signal input is a 60 Hz power signal input. Based on this set of assumptions, a memory buffer size needed for the large memory buffer 912 to capture 3 seconds of low sample rate data (e.g., 3 seconds of full bandwidth samples which include 3 seconds of low sample rate data) can be calculated as:

$$= 1024 \text{ samples} \times 60 \text{ Hz} \times 3 \text{ seconds} \times 2 \text{ bytes/sample} \quad \text{Eq. [1]}$$
$$= 368{,}640 \text{ bytes/channel}$$

For a multiple channel system that includes, for example, 10 channels of data (e.g., Va, Vb, Vc, Ia, Ib, Ic, etc.), a memory buffer size needed to accommodate the totality of data points is on the order of 3.6 Megabytes (i.e., 10 channels*386,640 bytes/channel). Those knowledgeable in the art will appreciate this requirement to be a very inefficient use of memory for at least the following reasons.

Each block of data transferred by the DSP (not shown) to the CPU 908 is pre-ordered where each block transfer is comprised of two sample groups. Namely, a first group of low resolution samples, which are transferred first by the DSP, followed by a second group (which is the balance of the full bandwidth samples) of high resolution samples. In successive cycles of operation, each group of low resolution samples are accumulated (stored) in the large memory buffer 912 until a trigger event occurs at which time the stored groups of low resolution samples in each cycle are placed in a storage device 910 for permanent storage.

This approach requires a large memory buffer 912 (e.g., 3.6 Megabytes for 3 seconds of data capture for 10 channels, where 3 seconds represents the time interval setting of the low resolution capture). Second, this approach also requires a certain amount of overhead in concentrating the respective blocks of low resolution samples for permanent storage. For example, for each frame of data transferred by the CPU 908 from the Dual Port memory 902 to permanent storage 910, there is included a block of samples of low resolution data followed by a block of samples of high resolution data (e.g., 32/224). As described above, each frame of data is placed in a single large memory buffer 912 in a repetitive sequenced order corresponding to a set of low resolution samples followed by a set of high resolution samples for a number of successive frames. At some point, the low resolution samples must be concentrated for permanent storage. In other words, the sets of low resolution samples must be extracted from the stored sequence of low resolution samples followed by high resolution samples and appended in time sequence order.

Second Memory Allocation Scheme

Referring now to FIG. 10 there is shown a second exemplary memory allocation scheme 1000, according to an embodiment of the disclosure. For ease of explanation, this embodiment assumes a high sample data rate of 1024 samples/cycle. In each cycle of data sampling, the complete frame of full bandwidth samples are read first from the dual port memory 1002 by CPU 1004. This full bandwidth data is written into a first buffer, designated as Buffer (1) 1008, to store the high rate samples. In a same cycle of operation, a block of low rate samples are either read by the CPU 1004 from Buffer 1 1008 (or otherwise read directly from the dual port memory 1002). The CPU 1004 reads the low rate samples as sequential blocks from Buffer (1) 1008 (or the dual port memory 1002) into a second buffer, designated as Buffer (2) 1010. Buffer (2) 1010 accumulates some number of seconds of the low rate samples (e.g., 3 seconds). It should be appreciated that the accumulation of the low rate samples in Buffer (2) 1010 is optimized in the sense that accumulation occurs as each data block of samples are read by the CPU 1008 without the need for concentration at some future point.

It is noted that this process is performed for each frame of data samples read by the CPU 1004 from the dual port memory 1002. In other words, Buffer 1 1008 and Buffer (2) 1010 are updated on a frame by frame basis so that when a trigger event occurs there is no re-ordering of data required nor further processing necessary other than saving the waveforms to a storage device 1006.

By way of example, if only one cycle of the high sample rate data is saved along with 3 seconds of low sample rate data, assuming a 1024 high sample rate and low sample rate of 128 per cycle, a total memory buffer size required can be calculated as:

$$= 1024 \text{ samples} \times 2 \text{ bytes} + 128 \text{ samples} \times 2 \text{ bytes} \times 60 \text{ Hz} \times 3 \text{ secs} \quad \text{Eq. [2]}$$

$$= 48{,}128 \text{ bytes per channel.}$$

It is understood that the sample rate of 1024 samples per cycle is for by way of explanation and not limitation. The sample rate is a matter of design choice. In general, the buffer size for storing the full bandwidth data is a function of a number of parameters, including, but not limited to, the number of cycles of data to be stored and the sampling rate. The reader will now be aware of other parameters.

For 10 channels the memory buffer size can be calculated as 480K bytes of memory. Buffer (2) 1010 stores only 3 seconds of data so that the oldest low resolution samples are overwritten as new low resolutions samples arrive. It is noted that while the memory size is significantly reduced as compared to the immediately preceding embodiment, an increased number of reads and writes are required. This occurs because the low sample rate data needs to be moved into its own dedicated buffer, Buffer (2) 1010, after all the data of the frame has been already written into the high sample rate buffer, Buffer (1) 1008.

Third Memory Allocation Scheme

Figure 11:
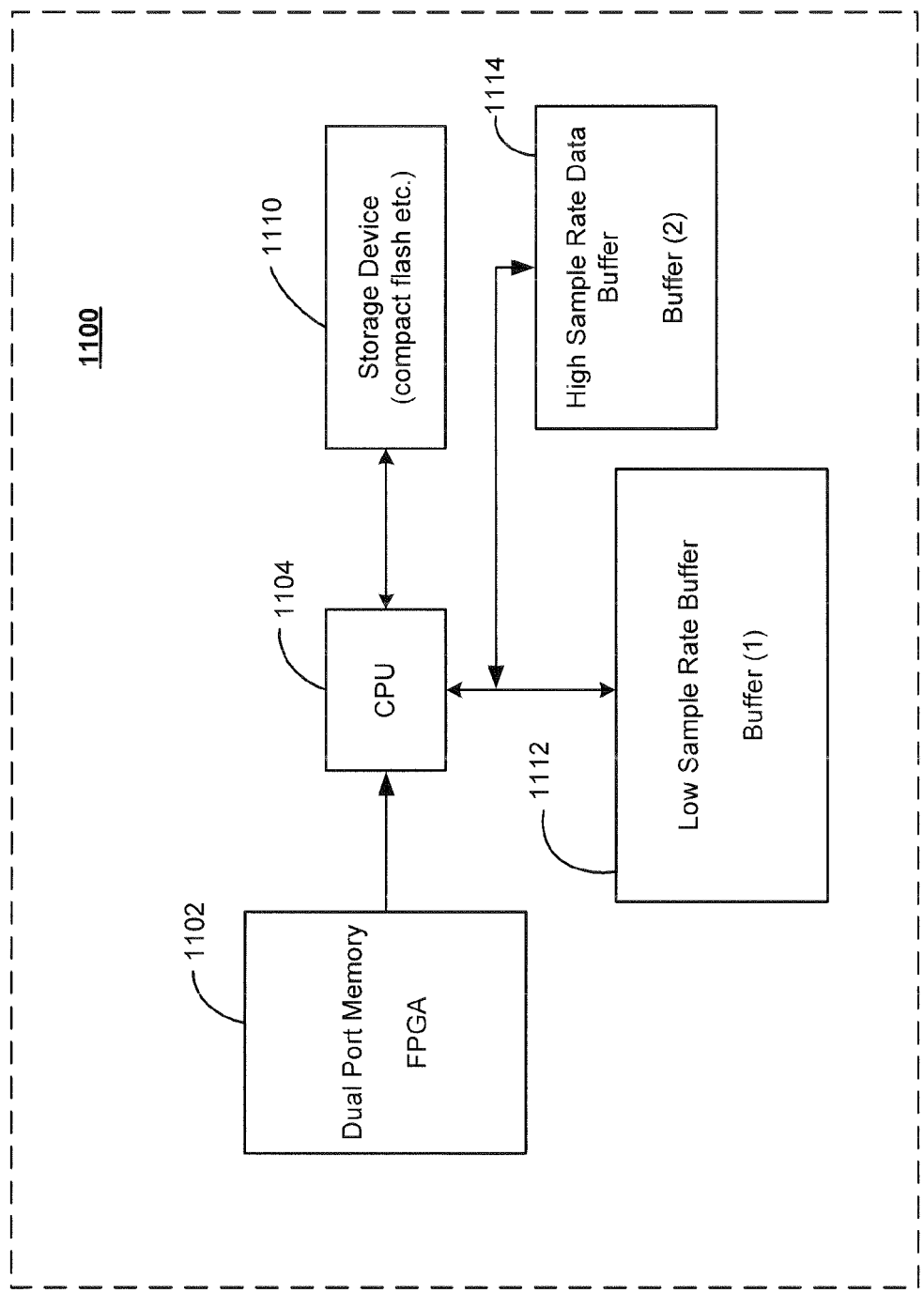
FIG. 11 illustrates a third exemplary memory allocation scheme, according to an embodiment of the present disclosure.

Referring now to FIG. 11 there is shown a third exemplary memory allocation scheme 1100, according to an embodiment of the disclosure. FIG. 11 illustrates an optimized approach which minimizes the number of reads and writes and the amount of memory resources required to be allocated. In accordance with this embodiment, the low sample rate data is read out from the dual port memory 1102 and written directly to a separate buffer dedicated to low resolution sample waveform capture, Buffer (1) 1112. For example, Buffer (1) 1112 may have a capacity to store three seconds of low sample rate data. The remainder rest of the data read from the dual port memory 1102 which constitutes high sample rate data excluding the low sample rate data point, is placed in a separate minimum sized buffer, Buffer (2) 1114.

By way of example, if the dual port memory 1102 stores a quarter of a cycle of sampled data where the maximum samples per cycle is 1024 samples, then the Dual Port Memory 1102 holds 256 data points. If the high sample rate is 1024 samples/cycle and the low sample rate is 128 samples/ cycle then the first 32 samples of the 256 samples stored in the Dual Port Memory 1102, which have been pre-ordered into one block of contiguous 32 data points of low sample rate data, are stored in Buffer (1) 1112. The balance of the data stored in the Dual Port Memory 1102, namely, the 224 data points (256−32) are stored into a small buffer constituting the high resolution, high sample rate data, i.e., Buffer (2) 1114.

Upon the occurrence of a trigger event associated with the low sample rate data, the 128 low sample rate data, stored in Buffer (1) 1112, can be directly written to permanent memory. Similarly the high sample rate data can be written to permanent memory upon a trigger event such as a transient event, with the additional CPU operation of having to only add back the 128 samples associated with the low sample rate capture.

This implementation can be performed on a cyclic basis as described above or on a half cycle or quarter cycle basis or any other convenient block size. This approach requires: ((896 samples per cycle×2 bytes)+(128 samples per cycle×2 bytes))×60 Hz×3 seconds=47,872 bytes per channel. For 10 channels this would require 478K.

This embodiment advantageously minimizes the memory resource requirements and also minimizes the movement of data by the CPU 1104 so that it maximizes both performance and resources. The capture of low resolution samples can be performed on a continuous real-time basis because the samples are pre-ordered and the accumulation time of the low resolution samples occurs at a much slower rate than the accumulation of full bandwidth samples leaving enough processing time so that the CPU can continuously capture low resolution samples and transfer them in real-time to the storage device 1110.

Although the disclosure herein has been described with reference to particular illustrative embodiments, it is to be understood that these embodiments are merely illustrative of the principles and applications of the present disclosure. Therefore numerous modifications may be made to the illustrative embodiments and other arrangements may be devised without departing from the spirit and scope of the present disclosure, which is defined by the appended claims.

Furthermore, although the foregoing text sets forth a detailed description of numerous embodiments, it should be understood that the legal scope of the present disclosure is defined by the words of the claims set forth at the end of this patent. The detailed description is to be construed as exemplary only and does not describe every possible embodiment, as describing every possible embodiment would be impractical, if not impossible. One could implement numerous alternate embodiments, using either current technology or technology developed after the filing date of this patent, which would still fall within the scope of the claims.

It should also be understood that, unless a term is expressly defined in this patent using the sentence "As used herein, the term '_____' is hereby defined to mean . . . " or a similar sentence, there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to in this patent in a manner consistent with a single meaning, that is done for sake of clarity only so as to not confuse the reader, and it is not intended that such claim term be limited, by implication or otherwise, to that single meaning Finally, unless a claim element is defined by reciting the word "means" and a function without the recital of any structure, it is not intended that the scope of any claim element be interpreted based on the application of 35 U.S.C. §112, sixth paragraph.

What is claimed is:

1. In an intelligent electronic device, a method of performing high resolution waveform capture to generate multi-rate waveform data in real-time, the method comprising the steps of:
   a) setting a desired first sample rate;
   b) reading an input digital stream of data sensed from an electrical power distribution system comprised of a plurality of time-ordered samples sampled at a second sample rate; and
   c) pre-ordering the read input digital stream in real-time as it is being written to a memory to create multi-rate waveform data comprised of a first low resolution data stream comprised of low resolution samples from among samples of the input digital stream at said first sample rate and a second high resolution data stream comprised of high resolution samples from among samples of the input digital stream at said second sample rate.

2. Method according to claim 1, wherein the high resolution samples of the high resolution data stream do not include the low resolution samples from among the input digital stream.

3. Method according to claim 1, wherein the high resolution samples of the high resolution data stream include the low resolution samples from among the input digital stream.

4. Method according to claim 1, where the second sample rate of the high resolution data stream is an integer multiple of the sample rate of the first sample rate of the low resolution data stream.

5. Method according to claim 1, wherein said pre-ordering step further comprises: remapping addresses for writing the read input digital stream to the memory device in a temporal sequential order with alternate addresses for writing the read input digital stream to the memory in a non-temporal non-sequential order.

6. Method according to claim 1, further comprising:
   storing the low resolution samples in a first memory buffer as low-resolution multi-rate waveform data; and
   storing the high resolution samples in a second memory buffer as high-resolution multi-rate waveform data.

7. Method according to claim 1, further comprising:
   receiving a conditioned analog stream; and
   converting the conditioned analog stream to the input digital stream.

8. Method according to claim 7, wherein the conditioned analog stream is sensed from a three phase power source.

9. The method according to claim 1, further comprising reconstituting the low resolution data stream and the high resolution data steam into a single data stream upon an occurrence of a trigger event.

10. The method according to claim 9, wherein the trigger events include at least one of a transient voltage spike, a sag in Root Mean Square (RMS) voltage and a swell in RMS voltage.

11. An intelligent electronic device comprising:
   means for setting a desired first sample rate;
   means for reading an input digital stream of data sensed from an electrical distribution system comprised of a plurality of time-ordered samples sampled at a second sample rate; and
   means for pre-ordering the read input digital stream in real-time as it is being written to a memory to create multi-rate waveform data comprised of a first low resolution data stream comprised of low resolution samples from among samples of the input digital stream at said first sample rate and a second high resolution data stream comprised of high resolution samples from among samples of the input digital stream at said second sample rate.

12. Intelligent electronic device according to claim 11, wherein the high resolution samples of the high resolution data stream do not include the low resolution samples from among the input digital stream.

13. Intelligent electronic device according to claim 11, wherein the high resolution samples of the high resolution data stream include the low resolution samples from among the input digital stream.

14. Intelligent electronic device according to claim 11, where the second sample rate of the high resolution data stream is an integer multiple of the sample rate of the first sample rate of the low resolution data stream.

15. Intelligent electronic device according to claim 11, wherein said means for pre-ordering further comprises: means for remapping addresses for writing the read input digital stream to the memory device in a temporal sequential order with alternate addresses for writing the read input digital stream to the memory in a non-temporal non-sequential order.

16. Intelligent electronic device according to claim 11, further comprising:
   a first memory buffer for storing the low resolution samples as low-resolution multi-rate waveform data; and
   a second memory buffer for storing the high resolution samples as high-resolution multi-rate waveform data.

17. Intelligent electronic device according to claim 11, further comprising:
   receiving a conditioned analog stream; and
   converting the conditioned analog stream to the input digital stream.

18. Intelligent electronic device according to claim 17, wherein the conditioned analog stream is sensed from a three phase power source.

19. Intelligent electronic device according to claim 11, further comprising means for reconstituting the low resolution data stream and the high resolution data steam into a single data stream upon an occurrence of a trigger event.

20. Intelligent electronic device according to claim 19, wherein the trigger events include at least one of a transient voltage spike, a sag in Root Mean Square (RMS) voltage and a swell in RMS voltage.

21. An intelligent electronic device comprising:
   at least one analog-to-digital converter for sampling waveform data;
   a field programmable gate array (FPGA) for controlling the at least one analog-to-digital converter to sample the waveform data and for reading the sampled waveform data from the at least one analog-to-digital converter and for writing the sampled waveform data to a digital signal processor;
   the digital signal processor for receiving the sampled waveform data from the FPGA, for processing the received sampled waveform data and for storing the processed sampled waveform data in a memory;
   the memory for storing the processed sampled waveform data received from the digital signal processor; and
   a processor for reading the processed data from the memory for further processing, presentation and storage,
   wherein the FPGA is further configured to remap the processed data as pre-ordered data as it writes the data to the digital signal processor.

22. The intelligent electronic device of claim 21, wherein the digital signal processor is configured as part of the FPGA.

23. An intelligent electronic device comprising:
- at least one analog-to-digital converter for sampling waveform data;
- a field programmable gate array (FPGA) for controlling the at least one analog-to-digital converter to sample the waveform data and for reading the sampled waveform data from the at least one analog-to-digital converter and for writing the sampled waveform data to a digital signal processor;
- the digital signal processor for receiving the sampled waveform data from the FPGA, for processing the received sampled waveform data and for storing the processed sampled waveform data in a memory;
- the memory for storing the processed sampled waveform data received from the digital signal processor; and
- a processor for reading the processed data from the memory for further processing, presentation and storage,
- wherein the digital signal processor remaps the processed sampled waveform data as it writes the data to the memory.

24. The intelligent electronic device of claim 23, wherein the digital signal processor is configured as part of the FPGA.

25. An intelligent electronic device comprising:
- at least one analog-to-digital converter for sampling waveform data;
- a field programmable gate array (FPGA) for controlling the at least one analog-to-digital converter to sample the waveform data and for reading the sampled waveform data from the at least one analog-to-digital converter and for writing the sampled waveform data to at least one processor, wherein the FPGA remaps the sampled waveform data as pre-ordered data as it writes the data to the at least one processor;
- the at least one processor for receiving the sampled waveform data from the FPGA, for processing the received sampled waveform data and for storing the processed sampled waveform data in a memory; and
- the memory for storing the processed sampled waveform data received from the at least one processor.

26. An intelligent electronic device comprising:
- at least one analog-to-digital converter for sampling waveform data;
- a field programmable gate array (FPGA) for controlling the at least one analog-to-digital converter to sample the waveform data and for reading the sampled waveform data from the at least one analog-to-digital converter and for writing the sampled waveform data to at least one processor;
- the at least one processor for receiving the sampled waveform data from the FPGA, for processing the received sampled waveform data and for storing the processed sampled waveform data in a memory, wherein the at least one processor remaps the processed sampled waveform data as it writes the data to the memory; and
- the memory for storing the processed sampled waveform data received from the at least one processor.

* * * * *